United States Patent
Yang et al.

(10) Patent No.: US 9,820,044 B2
(45) Date of Patent: Nov. 14, 2017

(54) SYSTEM FOR INCREASING PERCEIVED LOUDNESS OF SPEAKERS

(71) Applicant: DTS LLC, Calabasas, CA (US)

(72) Inventors: Sarah Yang, Irvine, CA (US); Richard J. Oliver, Capistrano Beach, CA (US); Robert C. Maling, III, Huntington Beach, CA (US)

(73) Assignee: DTS LLC, Calabasas, CA (US)

( * ) Notice: Subject to any disclaimer, the term of this patent is extended or adjusted under 35 U.S.C. 154(b) by 891 days.

(21) Appl. No.: 14/010,405

(22) Filed: Aug. 26, 2013

(65) Prior Publication Data

US 2013/0343573 A1    Dec. 26, 2013

Related U.S. Application Data

(62) Division of application No. 12/539,380, filed on Aug. 11, 2009, now Pat. No. 8,538,042.

(51) Int. Cl.
*H03G 3/00*     (2006.01)
*H03G 5/00*     (2006.01)
(Continued)

(52) U.S. Cl.
CPC ............... *H04R 3/04* (2013.01); *H03G 5/165* (2013.01)

(58) Field of Classification Search
CPC . H04R 3/04; H03G 7/00; H03G 7/002; H03G 7/007; H03G 7/06; H03G 9/005;
(Continued)

(56) References Cited

U.S. PATENT DOCUMENTS 3,101,446 A    8/1963   Glomb et al.
3,127,477 A    3/1964   David, Jr. et al.
(Continued)

FOREIGN PATENT DOCUMENTS

AT    07753095.4    12/2008
AU    2005299410    5/2006
(Continued)

OTHER PUBLICATIONS

International Search Report and Written Opinion in PCT/US2012/048378, dated Jan. 21, 2014.
(Continued)

*Primary Examiner* — Xu Mei
(74) *Attorney, Agent, or Firm* — Knobbe Martens Olson & Bear LLP

(57) ABSTRACT

A system can be provided for increasing loudness of an audio signal to present a perceived loudness to a listener that is greater than a loudness provided natively by a loudspeaker. The system can include one or more of the following: a frequency suppressor, a loudness adjuster, an equalizer, and a distortion control module. The frequency suppressor can increase headroom in the audio signal by filtering out low and/or high frequencies. The loudness adjuster can calculate a loudness of the audio signal and apply a gain to the audio signal to increase the loudness. The equalizer can further increase headroom by attenuating portions of a passband of the loudspeaker's frequency response. The distortion control module can induce partial harmonic distortion in the audio signal to further increase loudness.

7 Claims, 18 Drawing Sheets

(51) Int. Cl.
*H04R 3/04* (2006.01)
*H03G 5/16* (2006.01)

(58) Field of Classification Search
CPC ...... H03G 9/025; H03G 11/00; H03G 11/002;
H03G 11/006; H03G 11/008; H03G
11/04; H03G 11/06; H03G 11/08; H03G
5/16; H03G 5/165; H03G 5/24; G10H
1/0091; G10H 1/16; G10H 3/187
USPC .................. 381/61, 98, 106; 333/14; 455/72
See application file for complete search history.

(56) References Cited

U.S. PATENT DOCUMENTS

| | | | |
|---|---|---|---|
| 3,665,345 A | 5/1972 | Dolby | |
| 3,828,280 A | 8/1974 | Dolby | |
| 3,845,416 A | 10/1974 | Dolby | |
| 3,846,719 A | 11/1974 | Dolby | |
| 3,903,485 A | 9/1975 | Dolby | |
| 3,967,219 A | 6/1976 | Dolby | |
| 4,074,083 A | 2/1978 | Berkovitz et al. | |
| 4,355,383 A | 10/1982 | Dolby | |
| 4,490,691 A | 12/1984 | Dolby | |
| 4,700,361 A | 10/1987 | Todd et al. | |
| 4,739,514 A | 4/1988 | Short et al. | |
| 4,882,758 A | 11/1989 | Uekawa et al. | |
| 4,887,299 A | 12/1989 | Cummins et al. | |
| 5,027,410 A | 6/1991 | Williamson et al. | |
| 5,172,358 A | 12/1992 | Kimura | |
| 5,175,769 A | 12/1992 | Hejna, Jr. et al. | |
| 5,237,559 A | 8/1993 | Murphy et al. | |
| 5,278,912 A | 1/1994 | Waldhauer | |
| 5,363,147 A | 11/1994 | Joseph et al. | |
| 5,402,500 A | 3/1995 | Sims, Jr. | |
| 5,471,527 A | 11/1995 | Ho et al. | |
| 5,500,902 A | 3/1996 | Stockham, Jr. et al. | |
| 5,530,760 A | 6/1996 | Paisley | |
| 5,537,479 A | 7/1996 | Kreisel et al. | |
| 5,544,140 A | 8/1996 | Seagrave et al. | |
| 5,579,404 A | 11/1996 | Fielder et al. | |
| 5,583,962 A | 12/1996 | Davis et al. | |
| 5,615,270 A | 3/1997 | Miller et al. | |
| 5,623,577 A | 4/1997 | Fielder | |
| 5,631,714 A | 5/1997 | Saadoun | |
| 5,632,003 A | 5/1997 | Davidson et al. | |
| 5,632,005 A | 5/1997 | Davis et al. | |
| 5,633,981 A | 5/1997 | Davis | |
| 5,659,466 A | 8/1997 | Norris et al. | |
| 5,663,727 A | 9/1997 | Vokac | |
| 5,677,987 A | 10/1997 | Seki et al. | |
| 5,710,752 A | 1/1998 | Seagrave et al. | |
| 5,727,119 A | 3/1998 | Davidson et al. | |
| 5,742,689 A | 4/1998 | Tucker et al. | |
| 5,757,465 A | 5/1998 | Seagrave et al. | |
| 5,812,969 A | 9/1998 | Barber | |
| 5,848,171 A | 12/1998 | Stockham, Jr. et al. | |
| 5,862,228 A | 1/1999 | Davis | |
| 5,873,065 A | 2/1999 | Akagiri et al. | |
| 5,896,358 A | 4/1999 | Endoh et al. | |
| 5,909,664 A | 6/1999 | Davis et al. | |
| 5,930,373 A | 7/1999 | Shashoua et al. | |
| 5,966,689 A | 10/1999 | McCree | |
| 6,002,776 A | 12/1999 | Bhadkamkar et al. | |
| 6,016,295 A | 1/2000 | Endoh et al. | |
| 6,021,386 A | 2/2000 | Davis et al. | |
| 6,041,295 A | 3/2000 | Hinderks | |
| 6,064,962 A | 5/2000 | Oshikiri et al. | |
| 6,084,974 A | 7/2000 | Niimi | |
| 6,088,461 A | 7/2000 | Lin et al. | |
| 6,108,431 A | 8/2000 | Bachler | |
| 6,148,085 A | 11/2000 | Jung | |
| 6,185,309 B1 | 2/2001 | Attias | |
| 6,211,940 B1 | 4/2001 | Seagrave et al. | |
| 6,240,388 B1 | 5/2001 | Fukuchi | |
| 6,263,371 B1 | 7/2001 | Geagan, III et al. | |
| 6,301,555 B2 | 10/2001 | Hinderks | |
| 6,311,155 B1 | 10/2001 | Vaudrey et al. | |
| 6,327,366 B1 | 12/2001 | Uvacek et al. | |
| 6,332,119 B1 | 12/2001 | Hinderks | |
| 6,351,733 B1 | 2/2002 | Saunders et al. | |
| 6,370,255 B1 | 4/2002 | Schaub et al. | |
| 6,430,533 B1 | 8/2002 | Kolluru et al. | |
| 6,442,278 B1 | 8/2002 | Vaudrey et al. | |
| 6,442,281 B2 | 8/2002 | Sato et al. | |
| 6,446,037 B1 | 9/2002 | Fielder et al. | |
| 6,473,731 B2 | 10/2002 | Hinderks | |
| 6,498,822 B1 | 12/2002 | Tanaka | |
| 6,529,605 B1 | 3/2003 | Christoph | |
| 6,606,388 B1 | 8/2003 | Townsend et al. | |
| 6,624,873 B1 | 9/2003 | Callahan, Jr. et al. | |
| 6,639,989 B1 | 10/2003 | Zacharov et al. | |
| 6,650,755 B2 | 11/2003 | Vaudrey et al. | |
| 6,651,041 B1 | 11/2003 | Juric | |
| 6,664,913 B1 | 12/2003 | Craven et al. | |
| 6,704,711 B2 | 3/2004 | Gustafsson et al. | |
| 6,760,448 B1 | 7/2004 | Gundry | |
| 6,766,176 B1 | 7/2004 | Gupta et al. | |
| 6,768,801 B1 | 7/2004 | Wagner et al. | |
| 6,784,812 B2 | 8/2004 | Craven et al. | |
| 6,891,482 B2 | 5/2005 | Craven et al. | |
| 6,920,223 B1 | 7/2005 | Fosgate | |
| 6,970,567 B1 | 11/2005 | Gundry et al. | |
| 6,980,933 B2 | 12/2005 | Cheng et al. | |
| 6,993,480 B1 | 1/2006 | Klayman | |
| 7,058,188 B1 | 6/2006 | Allred | |
| 7,072,477 B1 | 7/2006 | Kincaid | |
| 7,072,831 B1 | 7/2006 | Etter | |
| 7,116,789 B2 | 10/2006 | Layton et al. | |
| 7,152,032 B2 | 12/2006 | Suzuki et al. | |
| 7,280,664 B2 | 10/2007 | Fosgate et al. | |
| 7,283,954 B2 | 10/2007 | Crockett et al. | |
| 7,349,841 B2 | 3/2008 | Furuta et al. | |
| 7,394,908 B2 * | 7/2008 | Katou | G10H 1/0091 |
| | | | 381/101 |
| 7,395,211 B2 | 7/2008 | Watson et al. | |
| 7,418,394 B2 | 8/2008 | Cowdery | |
| 7,424,423 B2 | 9/2008 | Bazzi et al. | |
| 7,448,061 B2 | 11/2008 | Richards et al. | |
| 7,454,331 B2 | 11/2008 | Vinton et al. | |
| 7,461,002 B2 | 12/2008 | Crockett et al. | |
| 7,508,947 B2 | 3/2009 | Smithers | |
| 7,533,346 B2 | 5/2009 | McGrath et al. | |
| 7,536,021 B2 | 5/2009 | Dickins et al. | |
| 7,539,319 B2 | 5/2009 | Dickins et al. | |
| 7,551,745 B2 | 6/2009 | Gundry et al. | |
| 7,583,331 B2 | 9/2009 | Whitehead | |
| 7,610,205 B2 | 10/2009 | Crockett | |
| 7,617,109 B2 | 11/2009 | Smithers et al. | |
| 7,711,123 B2 | 5/2010 | Crockett | |
| 7,751,572 B2 | 7/2010 | Villemoes et al. | |
| 7,756,274 B2 | 7/2010 | Layton et al. | |
| 7,784,938 B2 | 8/2010 | Richards | |
| 7,925,038 B2 | 4/2011 | Taenzer et al. | |
| 7,965,848 B2 | 6/2011 | Villemoes et al. | |
| 7,973,878 B2 | 7/2011 | Whitehead | |
| 8,032,385 B2 | 10/2011 | Smithers et al. | |
| RE42,935 E | 11/2011 | Cheng et al. | |
| 8,085,941 B2 | 12/2011 | Taenzer | |
| 8,090,120 B2 | 1/2012 | Seefeldt | |
| 8,144,881 B2 | 3/2012 | Crockett et al. | |
| 8,204,742 B2 | 6/2012 | Yang et al. | |
| 8,315,398 B2 | 11/2012 | Katsianos | |
| 8,538,042 B2 * | 9/2013 | Yang | H04R 3/04 |
| | | | 381/103 |
| 8,687,818 B2 * | 4/2014 | Oxford | G10L 21/038 |
| | | | 381/61 |
| 8,907,822 B2 * | 12/2014 | Helmrich | G10L 19/022 |
| | | | 341/50 |
| 9,236,842 B2 * | 1/2016 | Katsianos | |
| 2001/0027393 A1 | 10/2001 | Touimi et al. | |
| 2002/0013698 A1 | 1/2002 | Vaudrey et al. | |
| 2002/0040295 A1 | 4/2002 | Saunders et al. | |
| 2002/0076072 A1 | 6/2002 | Cornelisse | |
| 2002/0097882 A1 | 7/2002 | Greenberg et al. | |

(56) References Cited

U.S. PATENT DOCUMENTS

| | | |
|---|---|---|
| 2002/0146137 A1 | 10/2002 | Kuhnel et al. |
| 2002/0147595 A1 | 10/2002 | Baumgarte |
| 2003/0002683 A1 | 1/2003 | Vaudrey et al. |
| 2003/0035549 A1 | 2/2003 | Bizjak |
| 2004/0024591 A1 | 2/2004 | Boillot et al. |
| 2004/0042617 A1 | 3/2004 | Beerends et al. |
| 2004/0042622 A1 | 3/2004 | Saito |
| 2004/0044525 A1 | 3/2004 | Vinton et al. |
| 2004/0057586 A1 | 3/2004 | Licht |
| 2004/0071284 A1 | 4/2004 | Abutalebi et al. |
| 2004/0076302 A1 | 4/2004 | Christoph |
| 2004/0078200 A1 | 4/2004 | Alves |
| 2004/0122662 A1 | 6/2004 | Crockett et al. |
| 2004/0148159 A1 | 7/2004 | Crockett et al. |
| 2004/0165730 A1 | 8/2004 | Crockett et al. |
| 2004/0172240 A1 | 9/2004 | Crockett et al. |
| 2004/0184537 A1 | 9/2004 | Geiger et al. |
| 2004/0190740 A1 | 9/2004 | Chalupper et al. |
| 2005/0065781 A1 | 3/2005 | Tell et al. |
| 2005/0069162 A1 | 3/2005 | Haykin et al. |
| 2005/0075864 A1 | 4/2005 | Kim |
| 2005/0246170 A1 | 11/2005 | Vignoli et al. |
| 2006/0002572 A1 | 1/2006 | Smithers et al. |
| 2006/0129256 A1 | 6/2006 | Melanson et al. |
| 2006/0130637 A1 | 6/2006 | Crewbouw |
| 2007/0025480 A1 | 2/2007 | Tackin et al. |
| 2007/0027943 A1 | 2/2007 | Jensen et al. |
| 2007/0056064 P1 | 3/2007 | Roose et al. |
| 2007/0092089 A1 | 4/2007 | Seefeldt et al. |
| 2007/0118363 A1 | 5/2007 | Sasaki et al. |
| 2007/0134635 A1 | 6/2007 | Hardy et al. |
| 2007/0268461 A1 | 11/2007 | Whitehead |
| 2007/0291959 A1 | 12/2007 | Seefeldt |
| 2008/0022009 A1 | 1/2008 | Yuen et al. |
| 2008/0170721 A1 | 7/2008 | Sun et al. |
| 2008/0228473 A1 | 9/2008 | Kinoshita |
| 2008/0232612 A1 | 9/2008 | Tourwe |
| 2008/0249772 A1 | 10/2008 | Martynovich et al. |
| 2008/0284677 A1 | 11/2008 | Whitehead et al. |
| 2009/0063159 A1 | 3/2009 | Crockett |
| 2009/0067644 A1 | 3/2009 | Crockett et al. |
| 2009/0112579 A1 | 4/2009 | Li et al. |
| 2009/0161883 A1 | 6/2009 | Katsianos |
| 2009/0220109 A1 | 9/2009 | Crockett et al. |
| 2009/0271185 A1 | 10/2009 | Smithers et al. |
| 2009/0304190 A1 | 12/2009 | Seefeldt et al. |
| 2009/0322800 A1 | 12/2009 | Atkins |
| 2010/0017540 A1 | 1/2010 | Seefeldt |
| 2010/0042407 A1 | 2/2010 | Crockett |
| 2010/0049346 A1 | 2/2010 | Boustead et al. |
| 2010/0060857 A1 | 3/2010 | Richards et al. |
| 2010/0066976 A1 | 3/2010 | Richards et al. |
| 2010/0067108 A1 | 3/2010 | Richards et al. |
| 2010/0067709 A1 | 3/2010 | Seefeldt |
| 2010/0073769 A1 | 3/2010 | Richards et al. |
| 2010/0076769 A1 | 3/2010 | Yu |
| 2010/0083344 A1 | 4/2010 | Schildbach et al. |
| 2010/0106507 A1 | 4/2010 | Muesch |
| 2010/0121634 A1 | 5/2010 | Muesch |
| 2010/0174540 A1 | 7/2010 | Seefeldt |
| 2010/0177903 A1 | 7/2010 | Vinton et al. |
| 2010/0179808 A1 | 7/2010 | Brown |
| 2010/0185439 A1 | 7/2010 | Crockett |
| 2010/0198378 A1 | 8/2010 | Smithers et al. |
| 2010/0202632 A1 | 8/2010 | Seefeldt et al. |
| 2010/0250258 A1 | 9/2010 | Smithers et al. |
| 2011/0022402 A1 | 1/2011 | Engdegard et al. |
| 2011/0022589 A1 | 1/2011 | Bauer et al. |
| 2011/0054887 A1 | 3/2011 | Muesch |
| 2011/0125507 A1 | 5/2011 | Yu |
| 2011/0137662 A1 | 6/2011 | Mcgrath et al. |
| 2011/0153050 A1 | 6/2011 | Bauer et al. |
| 2011/0188704 A1 | 8/2011 | Radhakrishnan et al. |
| 2011/0208528 A1 | 8/2011 | Schildbach et al. |
| 2011/0219097 A1 | 9/2011 | Crockett et al. |
| 2011/0221864 A1 | 9/2011 | Filippini et al. |
| 2011/0222835 A1 | 9/2011 | Dougherty et al. |
| 2011/0227898 A1 | 9/2011 | Whitehead |
| 2011/0243338 A1 | 10/2011 | Brown |
| 2011/0274281 A1 | 11/2011 | Brown et al. |
| 2011/0311062 A1 | 12/2011 | Seefeldt et al. |
| 2012/0008800 A1 | 1/2012 | Goerke |
| 2012/0039490 A1 | 2/2012 | Smithers |
| 2012/0046772 A1 | 2/2012 | Dickins |
| 2012/0063121 A1 | 3/2012 | Atkins |

FOREIGN PATENT DOCUMENTS

| | | |
|---|---|---|
| AU | 2007243586 | 11/2007 |
| AU | 2007309691 | 5/2008 |
| AU | 2008266847 | 12/2008 |
| BR | PI0518278-6 | 11/2008 |
| BR | PI0711063-4 | 7/2011 |
| BR | PI0711063-4 | 8/2011 |
| CA | 2581810 | 5/2006 |
| CN | 1910816 | 2/2007 |
| CN | 200580036760.7 | 10/2007 |
| CN | 200780011056.5 | 4/2009 |
| CN | 200780011710.2 | 4/2009 |
| CN | 200780014742.8 | 5/2009 |
| CN | 200780038594.3 | 9/2009 |
| CN | 200780049200.4 | 11/2009 |
| CN | 200780040917.2 | 12/2009 |
| CN | 200880008969.6 | 3/2010 |
| CN | 200880024506.9 | 6/2010 |
| CN | 200880024525.1 | 7/2010 |
| DE | 43 35 739 A1 | 5/1994 |
| DE | 10323126 | 8/2003 |
| EP | 0 661 905 B1 | 3/1995 |
| EP | 05818505.9 | 7/2007 |
| EP | 1 850 328 | 10/2007 |
| EP | 1987586 | 5/2008 |
| EP | 2082480 | 5/2008 |
| EP | 2122828 | 7/2008 |
| EP | 08768564.0 | 3/2010 |
| EP | 10184647.5 | 12/2010 |
| ES | 07754779.2 | 1/2009 |
| ES | 08780173.4 | 3/2010 |
| ES | 08780174.2 | 11/2011 |
| FR | 282 0573 | 8/2002 |
| GB | 2327835 | 2/1999 |
| GB | 2327835 | 5/2001 |
| HK | 09112054.9 | 12/2009 |
| HK | 10107878.0 | 5/2010 |
| HK | 09106026.6 | 7/2011 |
| JP | 6-334459 | 12/1994 |
| JP | 7-122953 | 5/1995 |
| JP | H11 509712 | 8/1999 |
| JP | 2002-507291 | 3/2002 |
| JP | 2006-524968 | 11/2006 |
| JP | 2007 104407 | 4/2007 |
| JP | 2007 522706 | 8/2007 |
| JP | 2007-539070 | 5/2008 |
| JP | 2009-504190 | 9/2009 |
| JP | 2009-504219 | 9/2009 |
| JP | 2009-507694 | 10/2009 |
| JP | 2009-533304 | 3/2010 |
| JP | 2009-535268 | 3/2010 |
| JP | 2009-544836 | 5/2010 |
| JP | 2009-553658 | 6/2010 |
| JP | 2010-517000 | 10/2010 |
| JP | 2010-516999 | 12/2010 |
| JP | 2011-025711 | 8/2011 |
| KR | 10-2009-7016247 | 9/2009 |
| KR | 10-2009-7019501 | 2/2010 |
| KR | 10-2008-7029070 | 6/2011 |
| MX | 2007/005027 | 6/2007 |
| MX | 2008/013753 | 3/2009 |
| MX | 2009/004175 | 4/2009 |
| MY | PI 20084037 | 3/2007 |
| MY | PI 20091346 | 8/2011 |
| MY | PI 20093743 | 8/2011 |
| RU | 2008143336 | 5/2010 |
| RU | 2008146747 | 6/2010 |

(56) References Cited

FOREIGN PATENT DOCUMENTS

| | | |
|---|---|---|
| RU | 2009118955 | 11/2010 |
| RU | 2009135056 | 3/2011 |
| RU | 2010105052 | 8/2011 |
| RU | 2010105057 | 8/2011 |
| SG | 200702926-7 | 10/2005 |
| SG | 200807478-3 | 3/2007 |
| SG | 200902133-8 | 9/2007 |
| SG | 200906211-8 | 6/2008 |
| TW | 94138593 | 7/2006 |
| TW | 96111810 | 4/2007 |
| TW | 96111338 | 1/2008 |
| TW | 96108528 | 2/2008 |
| TW | 96136545 | 7/2008 |
| TW | 96139833 | 7/2008 |
| TW | 96148397 | 9/2008 |
| TW | 97122852 | 3/2009 |
| TW | 97126352 | 3/2009 |
| TW | 97126643 | 4/2009 |
| TW | 99112159 | 2/2011 |
| TW | 99113664 | 2/2011 |
| TW | 99113477 | 7/2011 |
| VN | 1-2009-01972 | 4/2010 |
| VN | 1-2008-02889 | 4/2011 |
| VN | 1-2009-01011 | 6/2011 |
| WO | WO 97/25834 A2 | 7/1997 |
| WO | WO 97/42789 | 11/1997 |
| WO | WO 99/01863 | 1/1999 |
| WO | WO 01/31632 | 5/2001 |
| WO | WO 03/090208 A1 | 10/2003 |
| WO | WO 2004/019656 A2 | 3/2004 |
| WO | WO 2004/021332 | 3/2004 |
| WO | WO 2004/073178 A2 | 8/2004 |
| WO | WO 2004/098053 | 11/2004 |
| WO | WO 2004/111994 A2 | 12/2004 |
| WO | WO 2005/086139 A1 | 9/2005 |
| WO | WO 2006/019719 A1 | 2/2006 |
| WO | WO 2006/047600 | 5/2006 |
| WO | WO 2006/113047 A1 | 10/2006 |

OTHER PUBLICATIONS

Extended European Search Report issued in Application No. EP 09 84 9335 dated Dec. 8, 2015.
Office Action issued by the Korean Intellectual Property Office in Application No. 10-2012-7008874 dated Aug. 13, 2015.
Office Action issed by the Korean Intellectual Property Office in Application No. 10-2012-7004284 dated Apr. 18, 2016.
Office Action issued in Chinese Application No. 200880121963.X dated Aug. 14, 2013.
Office Action issued in Chinese Application No. 200880121963 dated Apr. 30, 2014.
Office Action issued in Chinese Application No. 200980160873.6 dated Oct. 23, 2013.
Office Action issued in corresponding Japanese Application No. 2012-524683 dated Feb. 26, 2014.
Extended European Search Report issued in Application No. 09848326.6 dated Jan. 8, 2014.
Advanced Television Systems Committee Inc., ATSC Recommended Practice: Techniques for Establishing and Maintaining Audio Loudness for Digital Television, May 25, 2011.
Anderton, Craig, "DC Offset: The Case of the Missing Headroom" Harmony Central. http://www.harmonycentral.com/docs/DOC-1082, Apr. 19, 2010.
Australian Broadcasting Authority (ABA) Investigation into Loudness of Advertisements (Jul. 2002).
Digital Entertainment, Perceptual Loudness Management for Broadcast Applications, White Paper, 18 pages, Jun. 2010.
Extended Search Report issued in European application No. 08868264.6 dated Sep. 12, 2012.
Glasberg et al., A Model of Loudness Applicable to Time-Varying Sounds (Journal of the Audio Engineering Society, Audio Engineering Society, New York, vol. 50, May 2002, pp. 331-342).

Hauenstein M., A Computationally Efficient Algorithm for Calculating Loudness Patterns of Narrowband Speech (Acoustics, Speech and Signal Processing, 1997 ICASSP-97 IEEE International Conference on Munich, Germany Apr. 21-24, 1997, Los Alamitos, CA, IEEE Comput. Soc., US, Apr. 21, 1997, pp. 1311-1314).
Hu et al. "A Perceptually Motivated Approach for Speech Enhancement", IEEE Transactions on Speech and Audio Processing, vol. 11, No. 5, Sep. 2003.
Immerseel et al., Digital Implementation of Linear Gammatone Filters: Comparison of Design Methods, (2003; 4(3):59-64, Acoustics Research Letters Online).
International Preliminary Report on Patentability issued in application No. PCT/US2009/053437 dated Feb. 14, 2012.
International Search Report and Written Opinion in PCT/US2009/053437, dated Oct. 2, 2009.
International Search Report and Written Opinion in PCT/US2009/056850, dated Nov. 2, 2009.
International Search Report for International Application No. PCT/US2008/087791, dated Feb. 24, 2009.
ISO226: 2003 (E) Acoustics—Normal Equal Loudness Level Contours.
ITU-R Radio Sector of ITU, Recommendation ITU-R BS.1770-2, Algorithms to Measure Audio Programme Loudness and True-Peak Audio Level, 24 pages, Mar. 2011.
Japanese Office Action dated Feb. 26, 2013, Japanese Application No. 2012-524683.
Khalil C. Haddad, et al., Design of Digital Linear-Phase FIR Crossover Systems for Loudspeakers by the Method of Vector Space Projections, Nov. 1999, vol. 47, No. 11, pp. 3058-3066.
Lin, L., et al. Auditory Filter Bank Design using Masking Curves (7th European Conference on Speech Communication and Technology, Sep. 2001).
Lund, Control of Loudness in Digital TV, (2006 NAB BEC Proceedings, pp. 57-65).
Moore, et al., A Model for the Prediction of Thresholds, Loudness and Partial Loudness (Journal of the Audio Engineering Society, Audio Engineering Society, New York, vol. 45, No. 4, Apr. 1997, pp. 224-240).
Office Action issued in corresponding Japanese Application No. 2010-539900 dated Jun. 12, 2012.
P1 Audio Processor, White Paper, May 2003, Safe Sound Audio 2003.
Poers, The Loudness Rollercoaster, Jünger Loudness Control Devices, 2 pages, http://junger-audio.com/technology/the-loudness-rollercoaster/ (2008).
Recommendation ITU-R BS.1770, Algorithms to measure audio programme loudness and true-peak audio level, pp. 1-19, 2006.
Roger Derry, PC Audio Editing with Adobe Audition 2.0 Broadcast, desktop and CD audio production, First edition 2006, Eisever Ltd.
Schottstaedt, SCM Repositories—SND Revision 1.2, Jul. 21, 2007, SourceForge, Inc.
SCM Repositories—SND Revision 1.2, Jul 21, 2007, SourceForge, Inc.
Seefeldt, et al., A New Objective Measure of Perceived Loudness, (Audio Engineering Society, Convention Paper 6236, 117th Convention, San Francisco, CA. Oct. 28-31, 2004).
Skovenborg et al., Evaluation of Designs for Loudness-Matching Experiments (2004, Poznan, Poland).
Skovenborg et al., Evaluation of Different Loudness Models with Music and Speech Material (2004, 117th Convention of the Audio Engineering Society, San Francisco, CA USA).
Stevens, Calculations of the Loudness of Complex Noise (Journal of the Acoustical Society of America 1956.
Zwicker et al., Psychoacoustics: Facts and Models (Springer-Verlag, Chapter 8, "Loudness," pp. 203-238, Berlin Heidelberg, 1990, 1999).
Zwicker, Psychological and Methodical Basis of Loudness (Acoustica, 1958).
International Search Report and Written Opinion issued in Application No. PCT/US2012/048378 dated Jan. 24, 2014.

(56) References Cited

OTHER PUBLICATIONS

Office Action issued by the Japanese Patent Office in Application No. 2014-523980 dated Aug. 16, 2016.

* cited by examiner

SYSTEM FOR INCREASING PERCEIVED LOUDNESS OF SPEAKERS

BACKGROUND

Description of the Related Technology

Physical size restrictions of portable media devices often force the size of the loudspeakers in such devices to be quite small. Small speaker drivers suffer from low output levels and generally cannot reproduce the entire audible frequency range. As amplitudes are increased, distortion is introduced and more battery power is consumed. The noisy environments in which these devices are typically used only contribute to the problem.

Existing solutions to combat the low levels emanating from these devices tend to involve the addition of hardware such as external speakers. These solutions work counter to the idea of portability by either increasing the bulk of a device that has been carefully designed to be small or by creating a greater number of gadgets to be carried around by consumers.

SUMMARY

In certain embodiments, a system is provided for increasing loudness of an audio signal to present a perceived loudness to a listener that is greater than a loudness provided natively by a loudspeaker. The system can include one or more of the following: a frequency suppressor, a loudness adjuster, an equalizer, and a distortion control module. The frequency suppressor can increase headroom in the audio signal by filtering out low and/or high frequencies. The loudness adjuster can calculate a loudness of the audio signal and apply a gain to the audio signal to increase the loudness. The equalizer can further increase headroom by attenuating portions of a passband of the loudspeaker's frequency response. The distortion control module can induce partial harmonic distortion in the audio signal to further increase loudness.

In certain embodiments, a system for increasing a loudness of an audio signal includes a frequency suppressor having one or more filters that can increase headroom in an electronic audio signal by filtering low and high frequencies of the electronic audio signal to produce a first filtered audio signal, where the low and high frequencies are substantially unreproducible by the speaker. The system can further include a loudness adjuster having a loudness analyzer that can calculate with one or more processors a loudness of the first filtered audio signal at least in part by processing the first filtered audio signal with one or more loudness filters that can approximate a human hearing system. The loudness analyzer can further compare the calculated loudness with a loudness reference level. The loudness adjuster can further include a gain control module that can compute one or more gains to be applied to the first filtered audio signal and to apply the one or more gains to the first filtered audio signal to produce an amplified audio signal. This computing of the one or more gains can be based at least partly on a difference between the calculated loudness and the loudness reference level. The system can further include a distortion control module that can induce partial harmonic distortion in the first filtered audio signal by at least mapping one or more samples of the first filtered audio signal to one or more values stored in a sum-of-sines table. The sum-of-sines table can be generated from a sum of lower-order harmonics.

In certain embodiments, a method of increasing perceived loudness of an audio signal can include receiving an electronic audio signal and processing the electronic audio signal with a frequency suppressor using one or more processors. The frequency suppressor can filter one or both of low frequencies and high frequencies of the electronic audio signal to produce a filtered audio signal, such that the filtered audio signal has increased headroom. The method can further include estimating a loudness of the filtered audio signal at least in part by processing the filtered audio signal with one or more loudness filters that can approximate a human hearing system to produce an estimated loudness of the audio signal. The method can further include computing one or more gains to be applied to the filtered audio signal based at least in part on the estimated loudness. Moreover, the method can include increasing loudness of the filtered audio signal by applying the one or more gains to the filtered audio signal.

In certain embodiments, a system for increasing a loudness of an audio signal includes a frequency suppressor having one or more filters that can increase headroom in an electronic audio signal by filtering one or both of low frequencies and high frequencies of the electronic audio signal to produce a filtered audio signal having a greater headroom than the electronic audio signal. The system can also include a loudness adjuster having a loudness analyzer that can estimate with one or more processors a loudness of the filtered audio signal and compare the calculated loudness with a loudness reference level. The loudness adjuster can also have a gain control module that can compute one or more gains based at least partly on a difference between the calculated loudness and the loudness reference level and to increase a loudness of the filtered audio signal by applying the one or more gains to the filtered audio signal to produce an amplified audio signal.

In certain embodiments, a computer-readable storage medium can be provided that has instructions stored thereon that cause one or more processors to perform a method of increasing perceived loudness of an audio signal. The method can include receiving an electronic audio signal and estimating a loudness of the electronic audio signal at least in part by processing the electronic audio signal with one or more loudness filters that can approximate a human hearing system to produce an estimated loudness of the audio signal. The method can also include computing one or more gains to be applied to the electronic audio signal based at least in part on the estimated loudness. The method can further include increasing perceived loudness of the electronic audio signal by applying the one or more gains to the electronic audio signal to produce an amplified audio signal. Moreover, the method can include increasing signal energy by inducing partial saturation in the amplified audio signal, wherein the inducing can include applying to the amplified audio signal a nonlinear transformation derived from a combination of harmonics.

In certain embodiments, a method of reducing clipping in an audio signal can include receiving an input audio signal, providing a sum-of-sines data structure having values generated from a sum of lower order harmonics, and using the sum-of-sines data structure with one or more processors to map the input audio signal to an output audio signal, such that at least some of the lower-order harmonics are added to the input audio signal. As a result, in certain embodiments at least a portion of the output audio signal has a greater energy than the input audio signal.

In certain embodiments, a method of increasing loudness of an audio signal can include receiving an electronic audio signal and processing the electronic audio signal with a frequency suppressor using one or more processors. The frequency suppressor can filter one or both of low and high frequencies of the electronic audio signal to produce a filtered audio signal, such that the filtered audio signal has increased headroom over the electronic audio signal. In certain embodiments, the frequency suppressor is not a crossover filter. The method can also include deriving one or more gains to apply to the filtered audio signal based at least in part on the increased headroom and applying one or more gains to the filtered audio signal to increase a loudness of the audio signal.

In certain embodiments, a method of increasing loudness of an audio signal includes receiving an electronic audio signal and providing an equalization filter having a frequency response that can attenuate passband areas of the electronic audio signal. The passband areas can correspond to areas of a frequency response of a speaker that are less reproducible by a loudspeaker. The method can also include applying the equalization filter to the electronic audio signal using one or more processors to increase headroom in the electronic audio signal. Moreover, the method can include using the increased headroom in the electronic audio signal to increase loudness of the electronic audio signal.

For purposes of summarizing the disclosure, certain aspects, advantages and novel features of the inventions have been described herein. It is to be understood that not necessarily all such advantages may be achieved in accordance with any particular embodiment of the inventions disclosed herein. Thus, the inventions disclosed herein may be embodied or carried out in a manner that achieves or optimizes one advantage or group of advantages as taught herein without necessarily achieving other advantages as may be taught or suggested herein.

BRIEF DESCRIPTION OF THE DRAWINGS

Throughout the drawings, reference numbers may be re-used to indicate correspondence between referenced elements. The drawings are provided to illustrate embodiments of the inventions described herein and not to limit the scope thereof.

DETAILED DESCRIPTION

I. Introduction

Mobile phones and other similar-sized devices tend to have small speakers that are limited in the volume of sound they produce. In the presence of background noise, it can therefore be difficult to hear a conversation, music, and other audio on a mobile phone.

This disclosure describes systems and methods for increasing the perceived loudness of speakers. These systems and methods can be used to cause speakers to sound louder than may be achieved by merely increasing volume. In certain embodiments, headroom of an audio signal is increased to prepare the audio signal to be adjusted for loudness. Headroom can be increased by filtering out frequencies the speaker cannot reproduce so that additional amplification levels may be available for the signal. The audio signal may then be analyzed according to one or more perceptual loudness curves to determine how loud the audio signal may be perceived. In cases where the perceived loudness may be lower, the gain of at least portions of the audio signal may be increased.

To further increase the loudness of the audio signal, in certain embodiments a distortion control process may be used. The distortion control process may add extra energy to the audio signal by inducing selected distortion. Distortion control may be performed in certain embodiments by mapping the audio signal to an output signal that has additional harmonics but fewer harmonics than a fully-saturated signal.

II. System Overview

Figure 1:
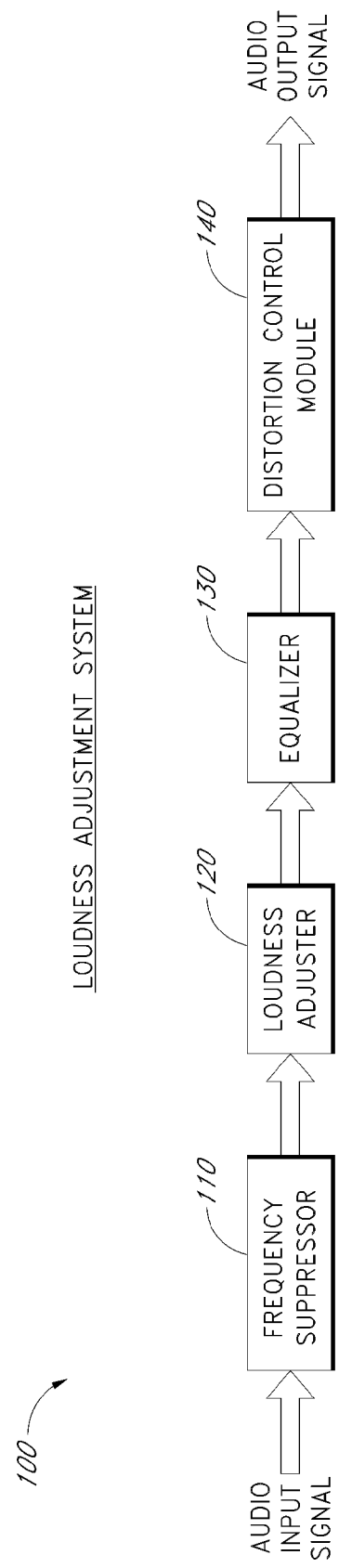
FIG. 1 illustrates an embodiment of a system for increasing the perceived loudness of audio signals.

FIG. 1 illustrates an embodiment of a loudness adjustment system 100 for adjusting the perceived loudness of audio signals. The loudness adjustment system 100 may be implemented in any audio system or processor-based system, such as a mobile phone, personal digital assistant (PDA), music player (e.g., MP3 players), television, or in any computing device, such as a laptop, desktop, tablet, or the like. Advantageously, in certain embodiments, the loudness adjustment system 100 may cause speakers to sound louder than may be achieved by merely increasing volume.

The depicted embodiment of the loudness adjustment system 100 includes a frequency suppressor 110, a loudness adjuster 120, an equalizer 130, and a distortion control module 140. Each of these components may be implemented in a machine having hardware and/or software. For example, these components may be implemented in one or more processors.

The frequency suppressor 110 receives an audio input signal and can filter out or suppress certain frequencies of the audio input signal. Low and high frequency signals, for example, are un-reproducible or less-reproducible by many small or low-quality speakers. If low or high frequency sounds are provided to such a speaker, the speaker might still attempt to reproduce the sounds even though the sounds would be inaudible. The unnecessary movement of the speaker in attempting to reproduce these frequencies can create distortion.

Thus, the frequency suppressor 110 in certain embodiments removes or attenuates certain of these less-reproducible frequencies. By filtering out less-reproducible frequencies, the frequency suppressor 110 may reduce distortion and also increase the headroom of the audio signal. The headroom of the audio signal can include a difference between a peak value of the audio signal and a saturation point of the audio signal. In a digital audio system, the saturation point might be 0 dB. In some embodiments, the frequency suppressor 110 does not increase headroom but does reduce the energy in the less-reproducible frequencies, allowing energy to be applied by the loudness adjuster 120 to the more reproducible frequencies.

The frequency suppressor 110 may include one or more filters (see, e.g., FIG. 2) to facilitate the removal of low and/or high frequencies. The cutoff frequencies of the filters and other filter characteristics may be speaker dependent, as different speakers may be able to reproduce different frequencies. The cutoff frequencies can be selected for various speakers by experimentation. For instance, a test signal may be supplied to a speaker, and audible frequencies may be detected in the frequency response. Thus, the frequency suppressor 110 may be customized for a particular speaker or speakers. The frequency suppressor 110 may also dynamically adjust the filters based on what type of speaker is used with the loudness adjustment system 100.

In certain embodiments, the frequency suppressor 110 may be used to filter out frequencies that are reproducible to provide additional headroom. The frequency suppressor 110 may perform this filtering even with speakers that are able to reproduce most frequencies. The increased headroom may allow greater loudness adjustment with a tradeoff in potentially less fidelity. This tradeoff may be acceptable in certain audio applications, such as in mobile phone applications.

Once the frequency suppressor 110 has filtered out certain frequencies from the audio input signal, the loudness adjuster 120 can use the newly added digital headroom to increase the loudness of the signal. Loudness can be an attribute of the human auditory system that allows for classification of sounds on a scale from quiet to loud. Perceived loudness may vary with frequency, unlike sound pressure levels measured in decibels (dB) (see FIG. 6). The loudness adjuster 120 in certain embodiments uses a psychoacoustic model of the human auditory system to determine a loudness of the filtered audio signal and to increase this loudness.

The loudness adjuster 120 may use perceived loudness information to apply one or more gains that can raise the level (e.g., the average level) of the reproducible frequency region in the filtered signal. In certain embodiments, the loudness adjuster of 120 uses certain of the loudness adjustment techniques described in U.S. patent application Ser. No. 12/340,364, filed Dec. 19, 2008, entitled "System for Adjusting Perceived Loudness of Audio Signals" (hereinafter "the '364 application"), the disclosure of which is hereby incorporated by reference in its entirety. More details on these techniques described in the '364 application are incorporated specifically by reference below.

In alternative embodiments, the loudness adjuster 120 may apply a gain to the filtered signal without determining perceived loudness. This gain may be about the same as the amount of headroom obtained by the frequency suppressor 110. The gain may also be more or less than the value of the headroom.

The loudness adjuster 120 provides an amplified signal to the equalizer 130. The equalizer 130 may be a parametric equalizer or the like that includes one or more filters for compensating or attempting to compensate for imperfections in the frequency response of the speaker. Because most speakers do not exhibit an ideal flat frequency response for all audible frequencies, the equalizer 130 can flatten peaks or valleys in the frequency response of the speaker in order to make the speaker act as though it had a more ideal response.

In some embodiments, parameters of the one or more filters of the equalizer 130, such as center frequency, roll-off, gain, and the like, can be selected by experimentation. For instance, a test signal may be supplied to the speaker, and peaks and valleys may be detected in the frequency response. The filter parameters may be selected so as to compensate for the peaks and valleys. The equalizer 130 filter may include multiple bands each having possibly different gains, for example, that are the inverse of the peaks and/or valleys, in order to produce a flatter response. The equalizer 130 may be able to dynamically select filter parameters based at least partly on the type of speaker used with the loudness adjustment system 100. Then, when the loudness adjuster 120 supplies an amplified audio signal to the equalizer 130, the equalizer 130 can apply the one or more filters created during the speaker testing phase.

In certain embodiments, the distortion control module 140 further increases the energy in the audio signal to cause the signal to sound louder. The distortion control module 140 may increase the signal energy by increasing the amplitude of certain portions of the audio signal and by applying selected distortion to certain portions of the audio signal. The distortion control module 140 can provide selected distortion by inducing harmonics in the audio signal. In certain embodiments, however, the distortion control module 140 induces fewer harmonics in the audio signal than are present in a fully-saturated or clipped signal. Thus, in certain embodiments, the distortion control module 140 uses a form of soft clipping to increase signal energy.

In one embodiment, the distortion control module 140 maps input samples to output samples using a mapping table or the like. The distortion control module 140 may map the signal linearly or approximately linearly for samples that are relatively lower in amplitude, such as samples that are not close to a peak value (e.g., 0 dB). The linear mapping can increase the amplitude of these samples. For samples that are close to the peak value, the distortion control module 140 may map the samples nonlinearly to induce some, but not full, harmonic distortion.

As a result, in certain embodiments, the distortion control module 140 can transform the audio signal into a louder audio signal with some but not excessive distortion. The tradeoff in some distortion versus greater loudness may be appreciated by some listeners. For example, when a listener uses a phone with a small speaker, the distortion control module 140 may cause a voice conversation to sound louder with little or no reduction in audio quality.

The distortion control module 140 may also be used to reduce or soften clipping in signals that are already saturated. Saturation or clipping might be caused by the equalizer 130 and/or the loudness adjuster 120, for instance. The distortion control module 140 may soften the clipping to reduce at least some of the distortion, while also preserving at least some of the increased signal energy provided by the loudness adjuster 120 and/or equalizer 130.

The features described above with respect to FIG. 1 may be varied in some embodiments. For instance, the equalizer 130 may be used to further reduce valleys in a speaker's frequency response instead of compensating for the valleys. Valleys in a speaker's response can indicate frequency regions that are less reproducible by a speaker. To save additional energy and/or headroom, the equalizer 130 can attenuate the valleys further. As a result, the speaker may produce little or no energy for those frequencies. Further, the equalizer 130 may be placed between the frequency suppressor 110 and the loudness adjuster 120 instead of after the loudness adjuster 120. Thus, the energy saved by the equalizer can be used by the loudness adjuster 120 to increase the loudness of other, more reproducible frequencies of the audio signal. The resulting output signal may have less audio fidelity but may sound louder, which could be useful for phone applications, among others.

In alternative embodiments, the equalizer 130 might be removed entirely from the loudness adjustment system 100. Similarly, any one of the components shown might not be included in a specific implementation. The loudness adjuster 120, for example, could be replaced with an overall gain that can be based at least partly on the amount of energy saved by the frequency suppressor 110 and/or equalizer 130. Moreover, in some instances, the loudness adjuster 120 and/or the distortion control module 140 may be replaced with a limiter or dynamic range compressor. Many other configurations may also be used.

Example implementations for each of the depicted components of the loudness adjustment system 100 will now be described in greater detail.

III. Frequency Suppression

Figure 2:
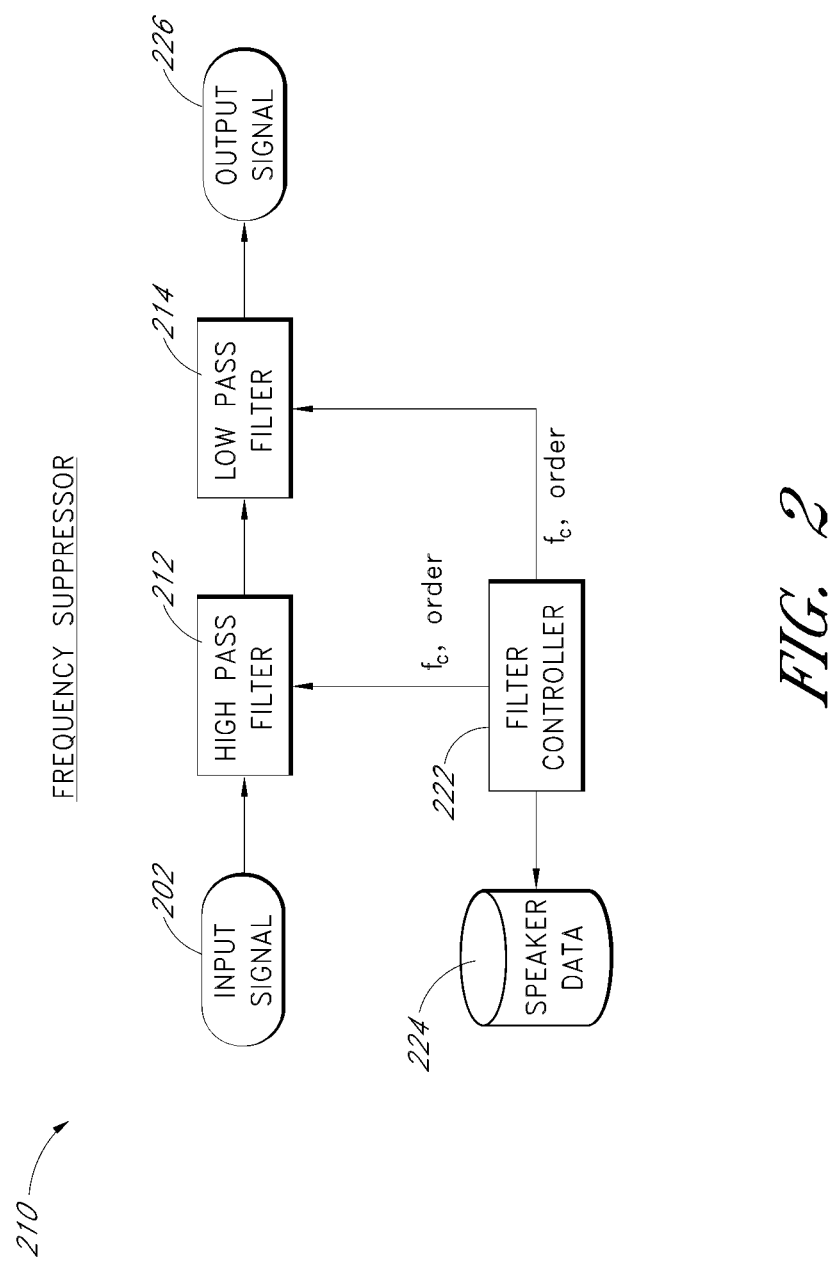
FIG. 2 illustrates an embodiment of a frequency suppressor of the system of FIG. 1.

Referring to FIG. 2, an example embodiment of a frequency suppressor 210 is shown. The frequency suppressor 210 may include all the features described above with respect to the frequency suppressor 110. The frequency suppressor 210 may be implemented in hardware and/or software.

Advantageously, in certain embodiments, the frequency suppressor 210 removes or reduces certain less-reproducible frequencies of an input signal 202, thereby increasing headroom and decreasing distortion in the input signal. Thus, in certain embodiments, the frequency suppressor 210 transforms data representing a physical audio signal into data representing another physical audio signal with increased headroom. In addition, another potential advantage of frequency suppression in certain embodiments is that an analog amplifier that provides an amplified signal to a speaker may not be driven as hard.

The frequency suppressor 210 includes filters 212, 214 for suppressing or reducing frequency content of an input signal 202. In the depicted embodiment, these filters 212, 214 include a high pass filter 212 and a low pass filter 214. The high pass filter 212 attenuates lower frequencies of the input signal 202, while the low pass filter 214 attenuates higher frequencies of the input signal 202 to produce an output signal 226. The order of the two filters 212, 214 may be reversed. Moreover, a band pass filter may be used in place of the two filters 212, 214 shown.

A filter controller 222 can dynamically adjust the cutoff frequencies, order, and other parameters of the filters 212, 214 based at least partly on speaker data obtained from a data repository 224. The data repository 224 may include one or more tables of filter parameters that correspond to different speakers. This data may be obtained by testing various speakers. A speaker can be tested by applying a pink noise signal or the like to the speaker and then measuring the output of the speaker using a microphone. The resulting frequency response can then be analyzed to determine which cutoff frequency, filter order, and/or other filter parameters could be effective in reducing less-reproducible frequencies.

The filter controller 222 can therefore select the appropriate cutoff frequencies, filter orders, and other parameters from the speaker data based at least partly on the type of speaker used with the frequency suppressor 210. Information about the type of speaker used may be supplied to the filter controller 222 by a manufacturer of a device that incorporates the frequency suppressor 210. A user interface could be provided with the loudness adjustment system 100, for example, that allows a manufacturer or user to tune various parameters of the frequency suppressor 210 and other components in the loudness adjustment system 100. In alternative embodiments, the filters 212, 214 are hardcoded with specific cutoff frequencies and/or filter orders and the filter controller 222 is not included with the frequency suppressor 210.

In certain embodiments, the frequency suppressor 210 is not a crossover filter. Whereas crossover filters are often used to split an audio signal into separate frequency bands that can be handled by different loudspeakers, the frequency suppressor 210 is used in certain embodiments to filter an audio signal that will be provided to a single loudspeaker. When driving a single speaker, currently-available devices may not remove the less reproducible frequencies from the audio signal. However, the frequency suppressor 210 advantageously removes these frequencies and/or other frequencies in certain embodiments and thereby increases headroom over currently-available single-speaker implementations. Moreover, crossover filters are typically used as the last (or nearly last) audio stage in an audio system, often providing a filtered signal directly to the loudspeakers. In contrast, in certain embodiments, the frequency suppressor 210 is a much earlier stage in an audio system, e.g., as shown in FIG. 1.

Figure 3:
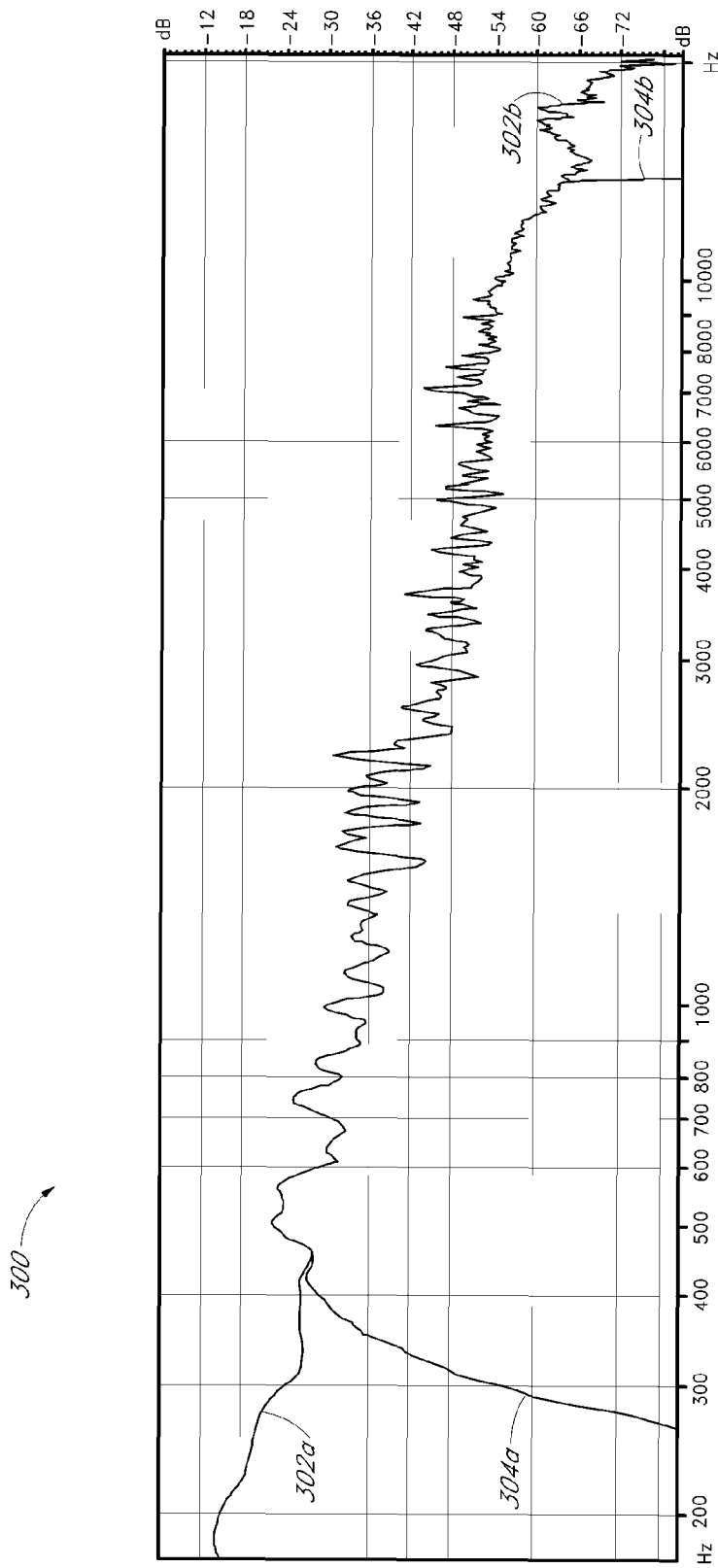
FIG. 3 illustrates example frequency spectrums of audio signals before and after frequency suppression by the frequency suppressor.
Figure 4:
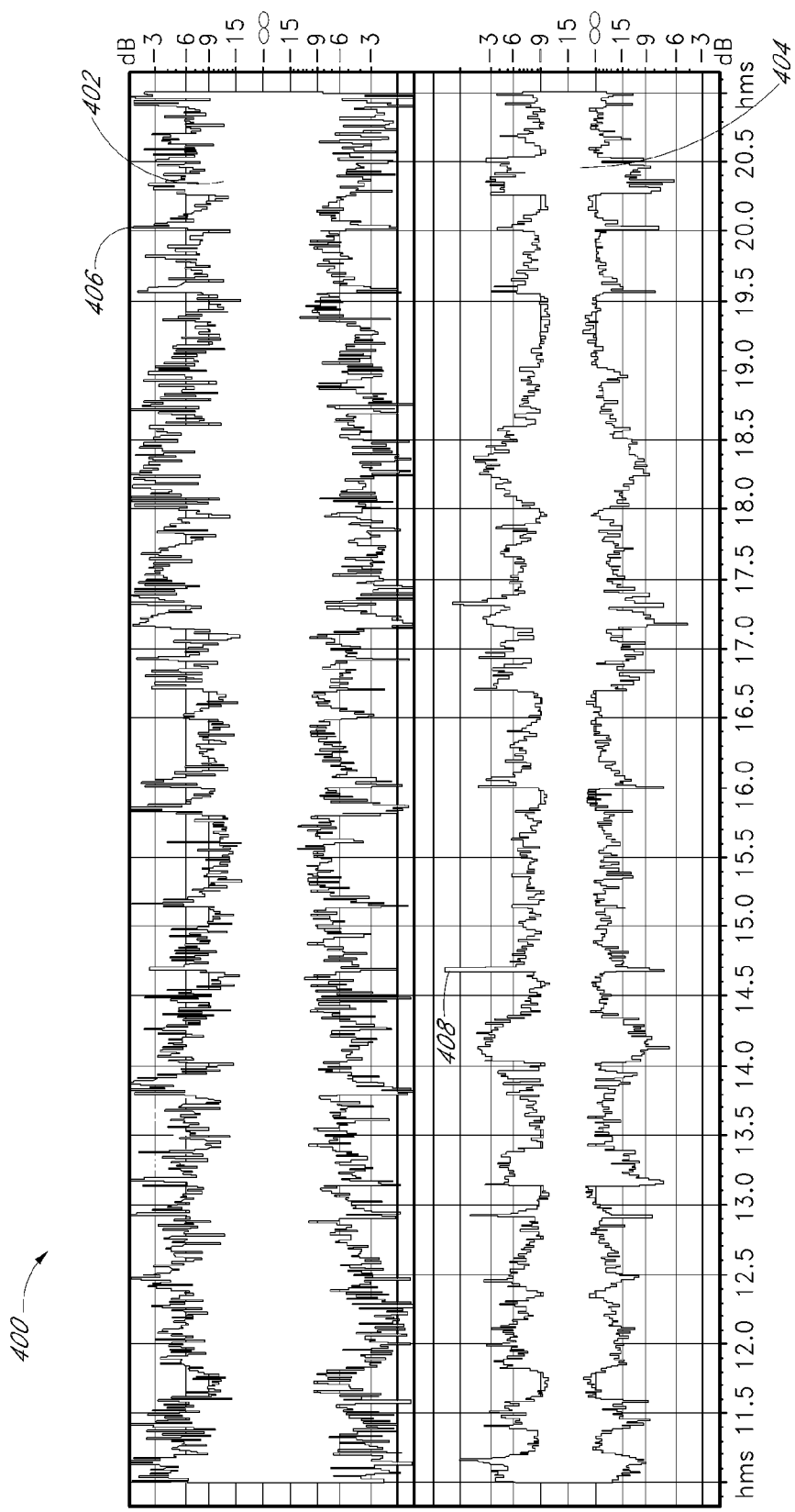
FIG. 4 illustrates example time domain representations of the audio signals of FIG. 3.

FIGS. 3 and 4 illustrate example plots 300, 400 of input and output signals of a frequency suppressor, such as the frequency suppressor 110 or 210. Referring to FIG. 3, an example plot 300 of an input signal frequency spectrum 302 and an output signal frequency spectrum 304 are shown. The input signal frequency spectrum 302 includes energy in the lower frequencies 302a and higher frequencies 302b that may not be reproducible by a given speaker. The less-reproducible low and high frequencies 302a, 302b have been attenuated in the output frequency spectrum 304 by the frequency suppressor 110 or 210. Removing or attenuating this energy can increase headroom for the output signal.

Time domain representations of these signals are shown in FIG. 4. In the plot 400 of FIG. 4, an input signal 402 corresponds to the input signal spectrum 302, and an output signal 404 corresponds to the output signal spectrum 304. As can be seen, a peak level 406 and average level of the input signal 402 have been reduced to the peak level 408 and average level in the output signal 404. This additional headroom leaves more room to increase the volume of the reproducible spectrum of the output signal 404.

IV. Loudness Adjustment

Figure 5:
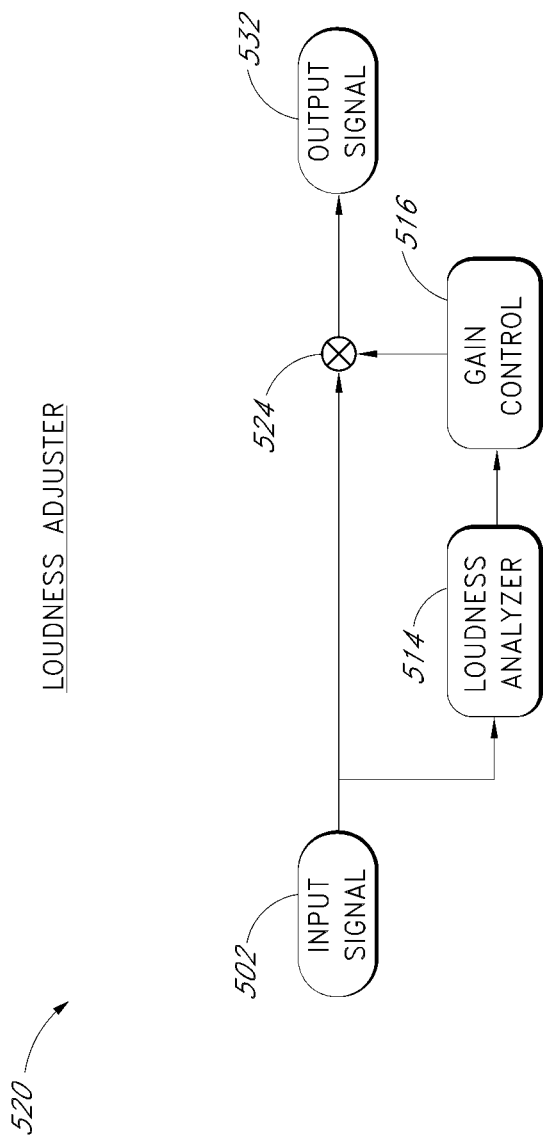
FIG. 5 illustrates an embodiment of a loudness adjuster of the system of FIG. 1.

Using the additional headroom provided by the frequency suppressor 110 or 210, the loudness of an audio signal can be increased. FIG. 5 illustrates a more detailed example of a loudness adjuster 520, which may have all of the features of the loudness adjuster 120 described above. The loudness adjuster 520 may be implemented in hardware and/or software. Advantageously, in certain embodiments, the loudness adjuster 520 can apply one or more gains to an audio signal that increase the perceived loudness of the signal to a listener. Thus, in certain embodiments, the loudness adjuster 520 transforms data representing a physical audio signal into data representing another physical audio signal with increased loudness.

Figure 6:
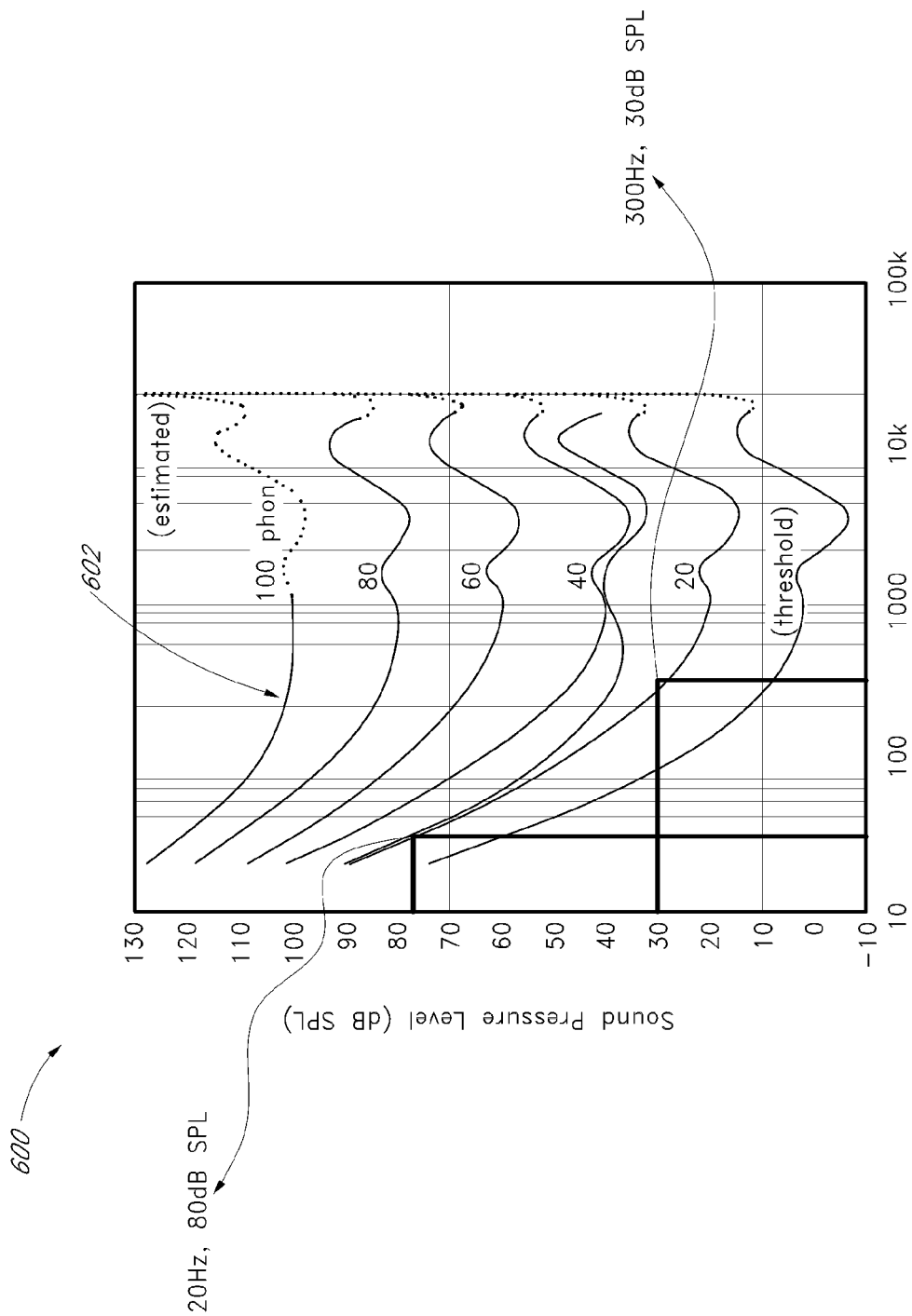
FIG. 6 illustrates a chart showing example equal loudness curves.

The human hearing system is often most sensitive to mid-range frequencies (for example, 250 Hz-5000 Hz). When two sounds, such as a bass sound and a midrange sound, are played at the same level or sound pressure level (SPL) as measured in decibels (dB SPL), the listener can perceive the midrange sound to be louder. A chart 600 in FIG. 6 illustrates example equal loudness curves 602 that demonstrate how a low frequency (20 Hz) might need an additional 50 dB SPL in order for someone to perceive it as being equally loud relative to a midrange frequency of 300 Hz. The fact that a very low frequency tone may not sound as loud to someone as a mid or even high frequency tone means that a midrange signal such as 300 Hz can have a greater effect in perceiving something is loud than a 20 Hz signal. Thus, in some implementations, the loudness adjuster 520 emphasizes mid-range frequencies to increase a perception of loudness.

Referring again to FIG. 5, the output signal 226 of the frequency suppressor can be provided as an input signal 502 to the loudness adjuster 520. The depicted embodiment of the loudness adjuster 520 includes a loudness analyzer 514 and a gain control module 516. The loudness analyzer 514 can estimate loudness of the input signal 502. In certain embodiments, the loudness analyzer 514 uses a nonlinear multiband model of the human hearing system to analyze the loudness characteristics of the audio input signal 502. This model can simulate the filter bank behavior of the human peripheral auditory system at least in part by applying one or more loudness filters to the input signal 202. In an embodiment, the loudness analyzer 514 can use some or all of the loudness calculation techniques described in paragraphs [0069] through [0083] of the '364 application, which paragraphs are specifically incorporated by reference herein in their entirety. For example, the loudness analyzer 514 may approximate one or more gammatone filters and use a power law function to estimate loudness.

The loudness analyzer 514 can operate on sample blocks of the input signal 502. The loudness analyzer 514 can estimate a loudness for each sample block. The loudness analyzer 514 can compare the estimated loudness of the sample block with a reference loudness level. The reference loudness level may be a peak allowable loudness level, which may be 0 dB in some digital systems. If the estimated loudness differs from the reference loudness level, the loudness analyzer 514 can output the level difference between the estimated loudness and the reference level. The gain control module 516 can use this level difference to apply one or more gains to the audio input signal 502, e.g., via a multiplication block 524. In some embodiments, the gain control module 516 can use some or all of the gain control techniques described in paragraphs [0084] through [0091] of the '364 application, which are specifically incorporated by reference herein in their entirety. For example, the gain control module 516 can dynamically generate gain coefficients based on changing loudness levels and can smooth the gain coefficients to avoid abrupt changes in gain.

Thus, in certain embodiments, the loudness adjuster 520 estimates loudness and calculates one or more gains as a function of frequency. The loudness adjuster 520 may then apply the one or more gains to each sample in the sample block. Thus, the gains may be applied in the time domain. In alternative embodiments, the loudness adjuster 520 can partition the input signal 502 into frequency bands and apply different gains to various frequency bands. In still other embodiments, the loudness adjuster 520 may apply a gain to the input signal 502 that is about the same value as the increase in headroom provided by the frequency suppressor 110 or 210.

Additional features may be included in the loudness adjuster 520 for reducing computing resource usage. For example, the preprocessing module described in the '364 application may be provided in some embodiments. Paragraphs [0030] and [0040] through [0044], which describe embodiments of the preprocessing module, are hereby specifically incorporated by reference herein in their entirety. Likewise, other modifications and features may be provided.

Figure 7:
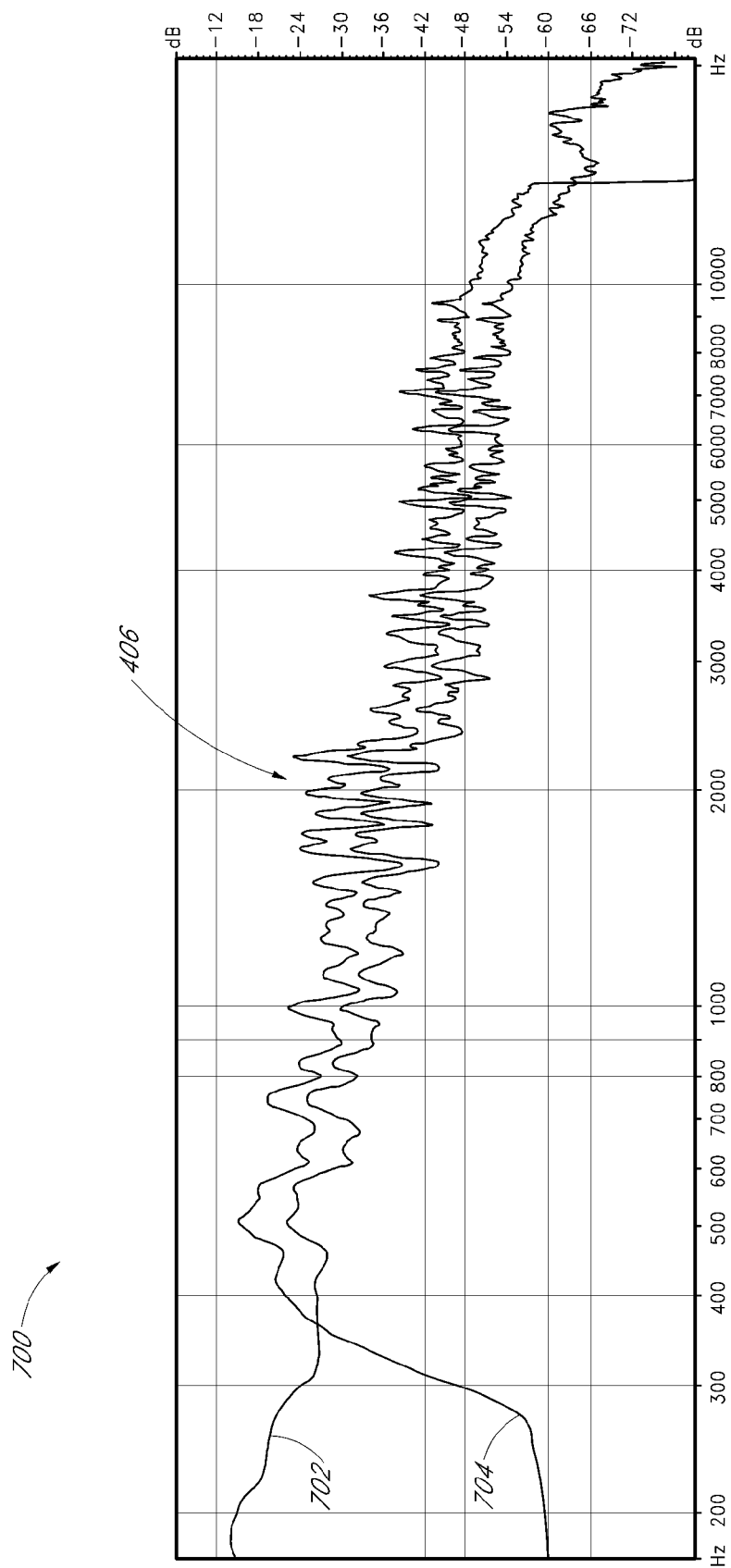
FIG. 7 illustrates example frequency spectrums of audio signals having increased gain based on loudness adjustment of the loudness adjuster.
Figure 8:
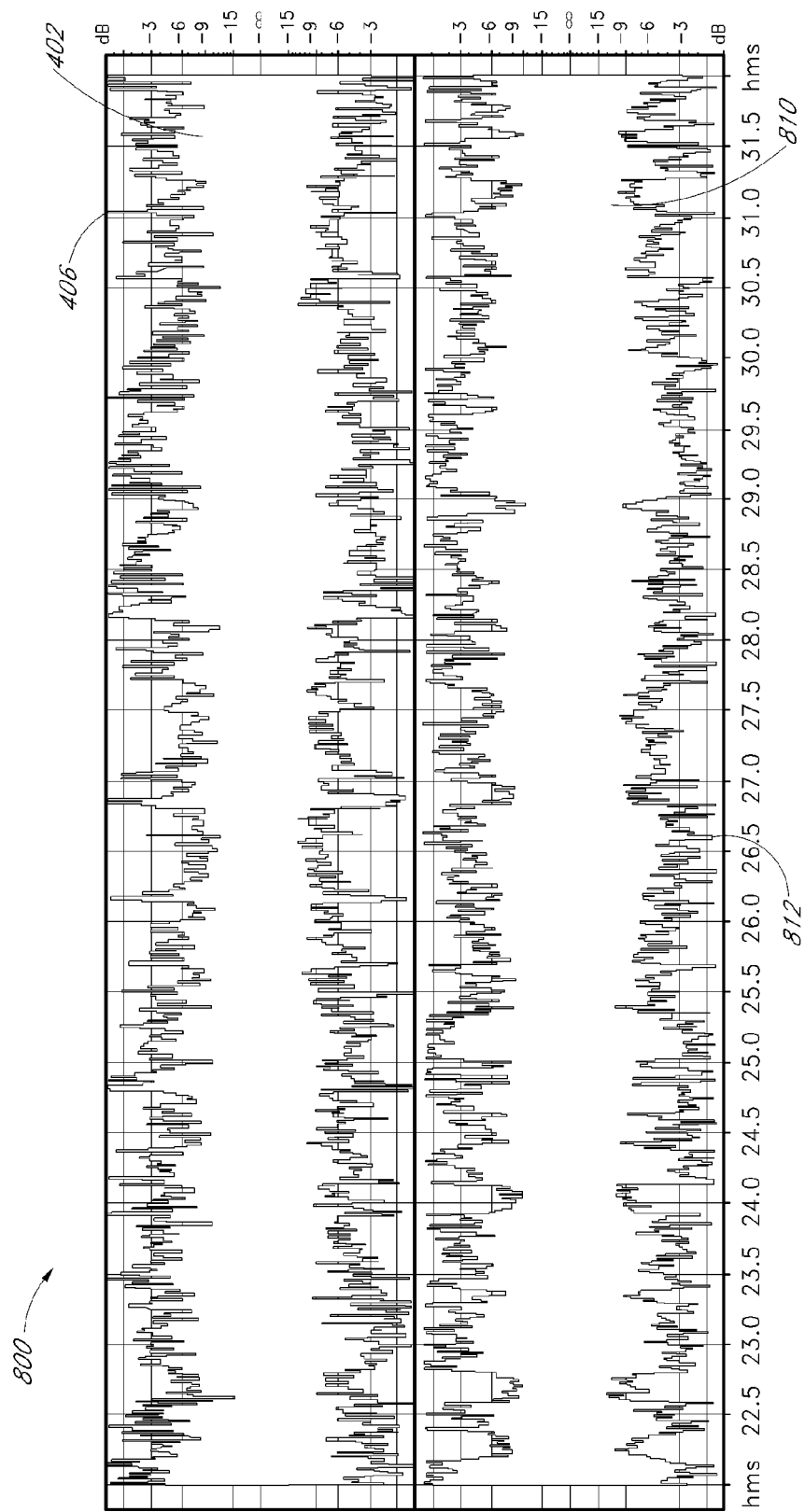
FIG. 8 illustrates example time domain representations of the audio signals of FIG. 7.

When the gain or gains are applied by the gain control module 516, the overall average level of the reproducible frequency region can be raised certain dBs. Alternatively, portions of the reproducible frequency region may be raised at different levels than other portions. In FIG. 7, a plot 700 shows an example boosted reproducible region 706 of a frequency spectrum 704 compared with the original frequency spectrum 302 of FIG. 3. FIG. 8 illustrates a plot 800 showing example time domain representations of the audio signals of FIG. 7. In FIG. 8, the original signal 402 is shown above the loudness-adjusted signal 810. It can be seen that a peak level 812 of the loudness-adjusted signal 812 has returned to match the original signal's 402 peak level 406, but the average level of the signal has increased. Thus, a listener's perception of loudness can increase.

V. Equalization

Figure 9:
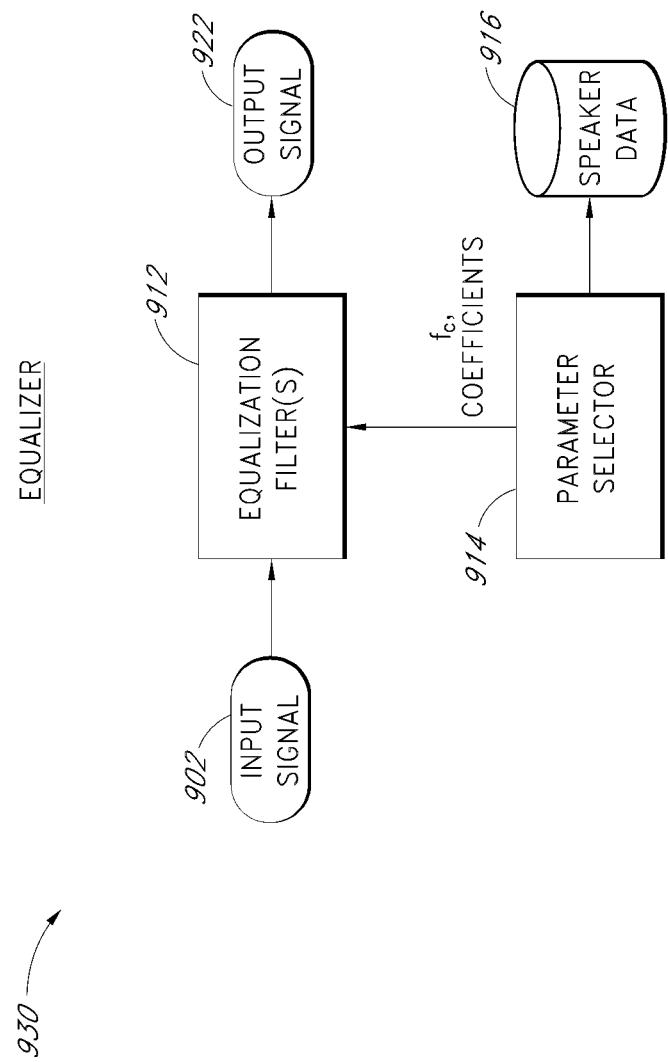
FIG. 9 illustrates an example equalizer of the system of FIG. 1.

FIG. 9 illustrates an example equalizer 930, which may have all of the features of the equalizer 130 described above. The equalizer 930 may be implemented in hardware and/or software. Advantageously, in certain embodiments, the equalizer 930 can apply one or more gains to an audio signal that compensate or attempt to compensate for imperfections in the frequency response of a speaker. Alternatively, the equalizer 930 can apply one or more gains that further attenuate valleys in the frequency response of a speaker.

The equalizer 930 may be a parametric equalizer or the like that includes one or more equalization filters 912. In one implementation, the equalization filter 912 can apply one or more filters to an input signal 902 received from the loudness adjuster 120 or 520, which can flatten peaks or valleys in the frequency response of the speaker. As a result, the filter 912 can apply gains that increase and/or attenuate portions of the input signal's 902 frequency spectrum. The filters 912 may apply gains to the valleys, for instance, that raise the valleys to the levels of the peaks.

The one or more equalization filters 912 may include one or more band pass filters, implemented, for example, using biquad Infinite Impulse Response (IIR) filters or the like. The one or more equalization filters 912 might instead include one or more of the equalization filters described in U.S. Publication No. 2008/0240467, filed Mar. 7, 2008, titled "Frequency-Warped Audio Equalizer," the disclosure of which is hereby incorporated by reference in its entirety. Other types of equalization filters may also be used.

A parameter selector 914 can provide filter parameters, such as gain coefficients, center frequencies, and the like, for the one or more equalization filters 912 based at least partly on speaker data stored in a data repository 916. In some embodiments, these speaker parameters can be selected by experimentation. For instance, a test signal may be supplied to a speaker, and frequencies and magnitudes of peaks and valleys may be detected in the frequency response. The filter parameters may be selected so as to compensate for the peaks and valleys. The parameter selector 914 may select gains at selected center frequencies, for example, that are the inverse of the peaks and/or valleys, in order to produce a flatter response.

The parameter selector 914 may be able to dynamically select filter parameters based at least partly on the type of speaker used. Information about the type of speaker used may be supplied to the parameter selector 914 by a manufacturer of a device that incorporates the equalizer 930. In alternative embodiments, the equalization filter 912 is hardcoded with specific filter parameters, and the parameter selector 914 is not included with the equalizer 930.

In alternative embodiments, the equalizer 930 may instead be used to further attenuate valleys in a speaker's frequency response instead of increasing a gain of the valleys. For example, the equalizer 930 may attenuate frequencies in a passband range of the speaker's frequency response. Attenuating the valleys can allow additional energy and/or headroom to be obtained. As a result, the speaker may produce little or no energy for those frequencies. The parameter selector 914 may, for instance, select gains at selected center frequencies of the valleys that attenuate the valleys. The one or more equalization filters 912 may instead be hardcoded with the appropriate gains. The energy saved by the equalizer 930 can be used by the loudness adjuster 120 to increase the loudness of other, more reproducible frequencies of the audio signal. The resulting output signal may have less audio fidelity but may sound louder, which can be a desirable outcome for some audio signals such as ringtones, voice, and the like.

Moreover, in some implementations the equalizer 930 attenuates one or more peaks in the speaker's frequency response instead of or in addition to attenuating valleys. Attenuating one or more peaks can also increase headroom.

VI. Distortion Control

Figure 10:
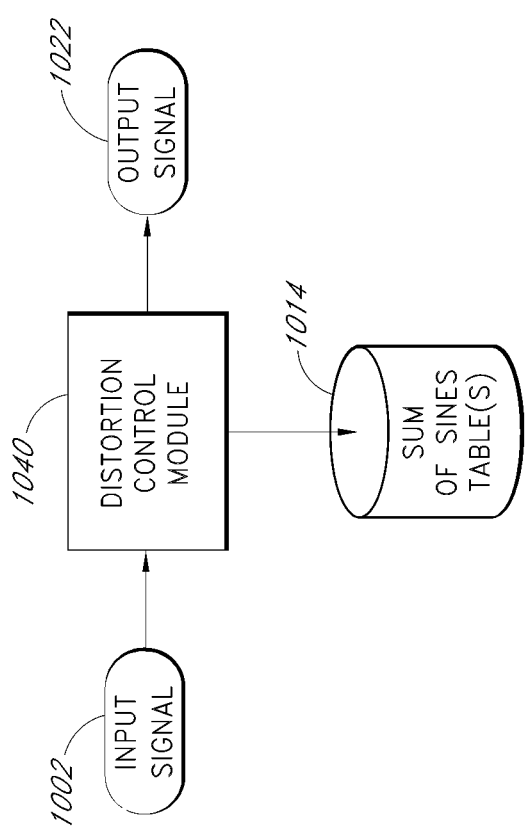
FIG. 10 illustrates an example distortion control module of the system of FIG. 1.

FIG. 10 illustrates a more detailed embodiment of a distortion control module 1040, which may have all of the features of the distortion control module 140 described above. The distortion control module 1040 may be implemented in hardware and/or software. In certain embodiments, the distortion control module 1040 can induce selected distortion in the audio signal to increase signal energy and hence loudness. This selected distortion may be a controlled distortion that adds fewer harmonics than are present in fully-saturated signals.

As described above, the distortion control module 1040 may induce selected distortion at least in part by mapping input samples into output samples. The distortion control module 1040 can perform this mapping by using samples of the input signal 1002 as indices into a sum-of-sines table 1014 or tables. The sum-of-sines table 1014 can include values that are generated by summing harmonically-related sine waves.

To illustrate, if the input signal 702 has a sample with a value m, the distortion control module 1040 can map the input sample to an output sample at an index m in the sum-of-sines table 1014. If the sample of the input signal 1002 falls between index values of the table 1014, the distortion control module 1040 can interpolate an index value. Using interpolation can allow the size of the sum-of-sines table 1014 to be reduced in order to save memory. However, the sum-of-sines table 1014 may be designed to be large enough so as to avoid the use of interpolation in certain embodiments. The distortion control module 1040 can use the mapped output value of the sum-of-sines table 1014 as an output sample for the output signal 1022.

The sum-of-sines table 1014 may be implemented as any data structure, such as an array, matrix, or the like. The table 1014 can be generated to include an arbitrary number of harmonic sine waves, including odd harmonics, even harmonics, or a combination of both. In certain embodiments, odd harmonics provide good distortion control for voice audio signals. Even harmonics may be used in other implementations and may be good for reducing clipping in music signals. Either odd or even harmonics may be used for mixed voice and music signals. However, these are merely illustrative examples, and either odd or even harmonics or both could be used for any application.

When more sine waves are used to generate the table 1014, the potential increase in signal energy and distortion is greater, and vice versa. As using a large number of sine waves could result in significant harmonic distortion, in certain embodiments, a relatively small number of lower-frequency sine waves are beneficially used to construct the sum-of-sines table 1014.

For instance, the table 1014 can be constructed from the sum of two or three harmonically-related sine waves, four sine waves, five sine waves, or more. Multiple sum-of-sines tables 1014 may be stored in a memory and may be used by the distortion control module 1040 for different purposes. For example, a sum-of-sines table 1014 with more harmonics might be used for voice signals while a table 1014 with fewer harmonics might be used for music to create less distortion.

The distortion control module 1040 may also provide a user interface that provides a distortion control for a user to adjust the amount of signal energy increase and/or distortion. For example, a graphical slider, knob, or the like may be provided, or the user may be able to press a physical or soft button to adjust the amount of energy increase or distortion applied. Increasing the distortion control could cause a table with more harmonics to be used, and vice versa.

An example process for generating a sum-of-sines table 1014 will now be described, using three odd-harmonically related sine waves. In this example, the sum-of-sines table 1014 can be generated by populating a first table of a selected size with values of one period of a sine wave (e.g., from 0 radians to 2 pi). Populating a table of size N (N being an integer) may include dividing one period of the sine wave into N values and assigning the N values to the N slots in the table. This first sine wave table can represent the fundamental or first harmonic.

A second table of the same size as the first table may be populated with three periods of a sine wave in a similar fashion, by dividing the three sine periods into N values. The values in the second table may represent the third harmonic of the first sine wave. Similarly, a third table of the same size as the first two may be populated with five periods of a sine wave, representing the fifth harmonic. The values in the first, second, and third tables may be scaled as desired. For instance, the values in the second table may be scaled lower to be lower in magnitude than those in the first table, and values in the third table may be scaled to include lower values than the second table.

Because the three tables are the same size in certain embodiments (e.g., have the same number of N entries), the values in corresponding indices of the three tables may be added together to create a new sum-of-sines table 1014 that includes the sum of the first, third, and fifth harmonics. Thus, if one were to plot the values in the sum-of-sines table 1014, in certain embodiments, an approximation of one period of the summed waves would be shown. The more sine waves that are used, in certain embodiments, the closer this plotted wave would look like a square wave. In various embodiments, other sum-of-sines tables with different harmonics may be constructed in a similar fashion to that described for three odd harmonics. Alternatively, portions of sine wave periods may be used, rather than full periods, to construct the sum-of-sines table 1014.

As the distortion control module 1040 maps samples from the input 1002 signal into the sum-of-sines table 1014, the frequency of the harmonics in the table 1014 may depend on the table lookup rate, which in turn can depend on the frequency of the input signal. This frequency dependence results in certain embodiments from the table-lookup operation being performed by the distortion control module 1040 at or near the same rate as the frequency of the input signal 1002.

To illustrate, for a simple sine wave input signal 1002 having a given frequency, the distortion control module 1040 could perform the mapping operation at the same frequency. The resulting harmonics would have particular frequencies that depend on the frequency of the sine wave. Doubling the frequency of the sine wave could therefore double the frequency of the harmonics. For input signals 1002 that include multiple frequencies superimposed, the mapping by the distortion control module 1040 could result in a superposition of harmonics.

Figure 11:
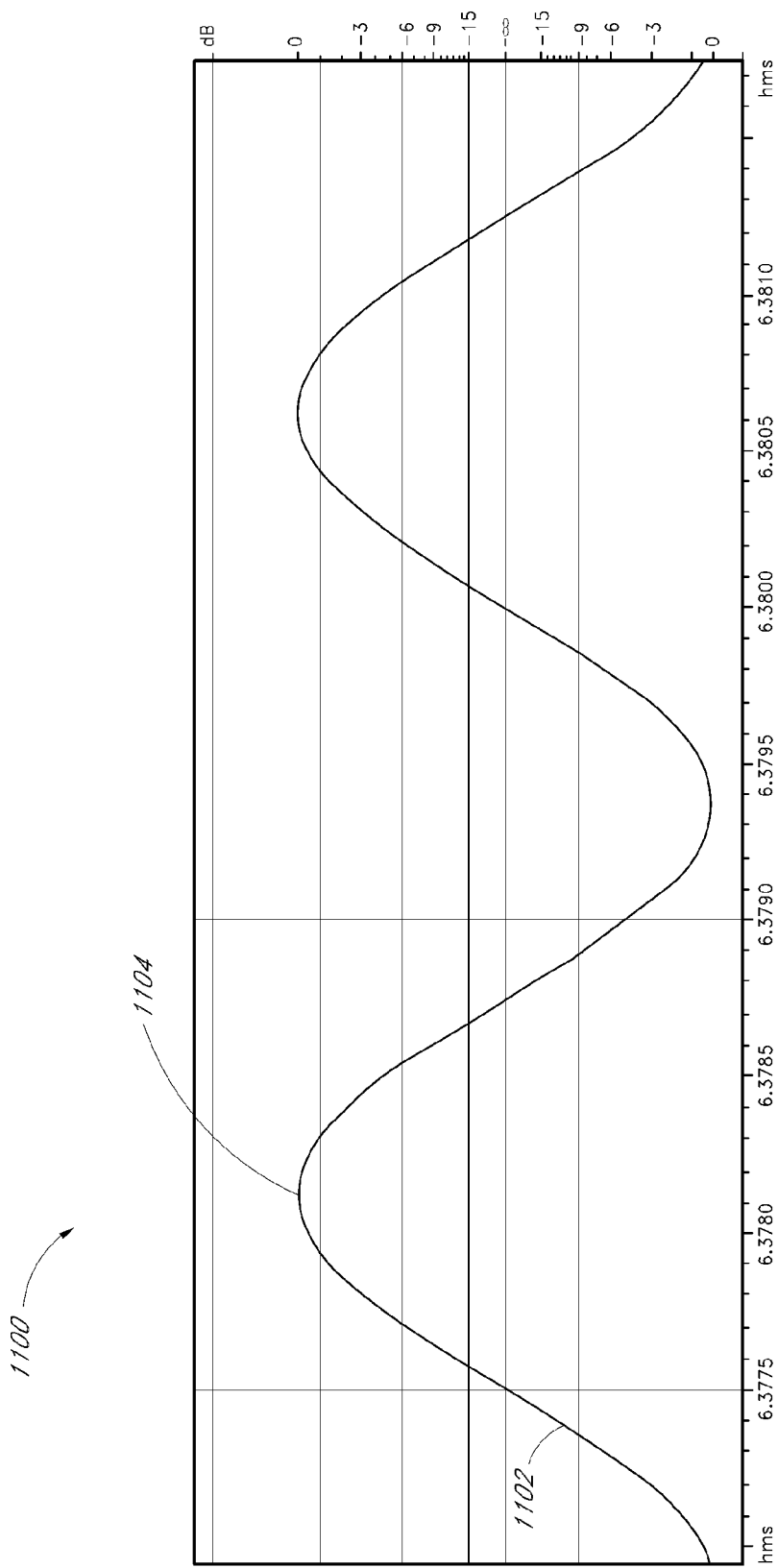
FIG. 11 illustrates an example time domain representation of a sine wave.
Figure 12:
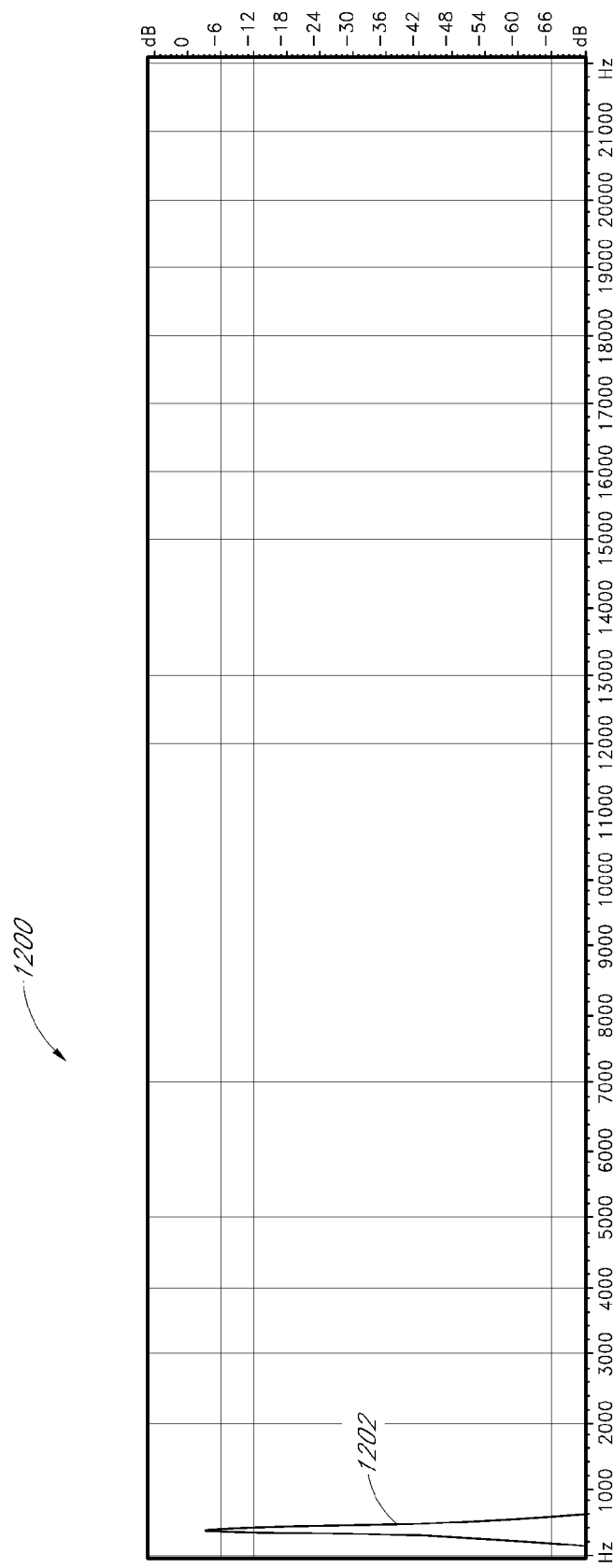
FIG. 12 illustrates an example frequency spectrum of the sine wave of FIG. 11.
Figure 13:
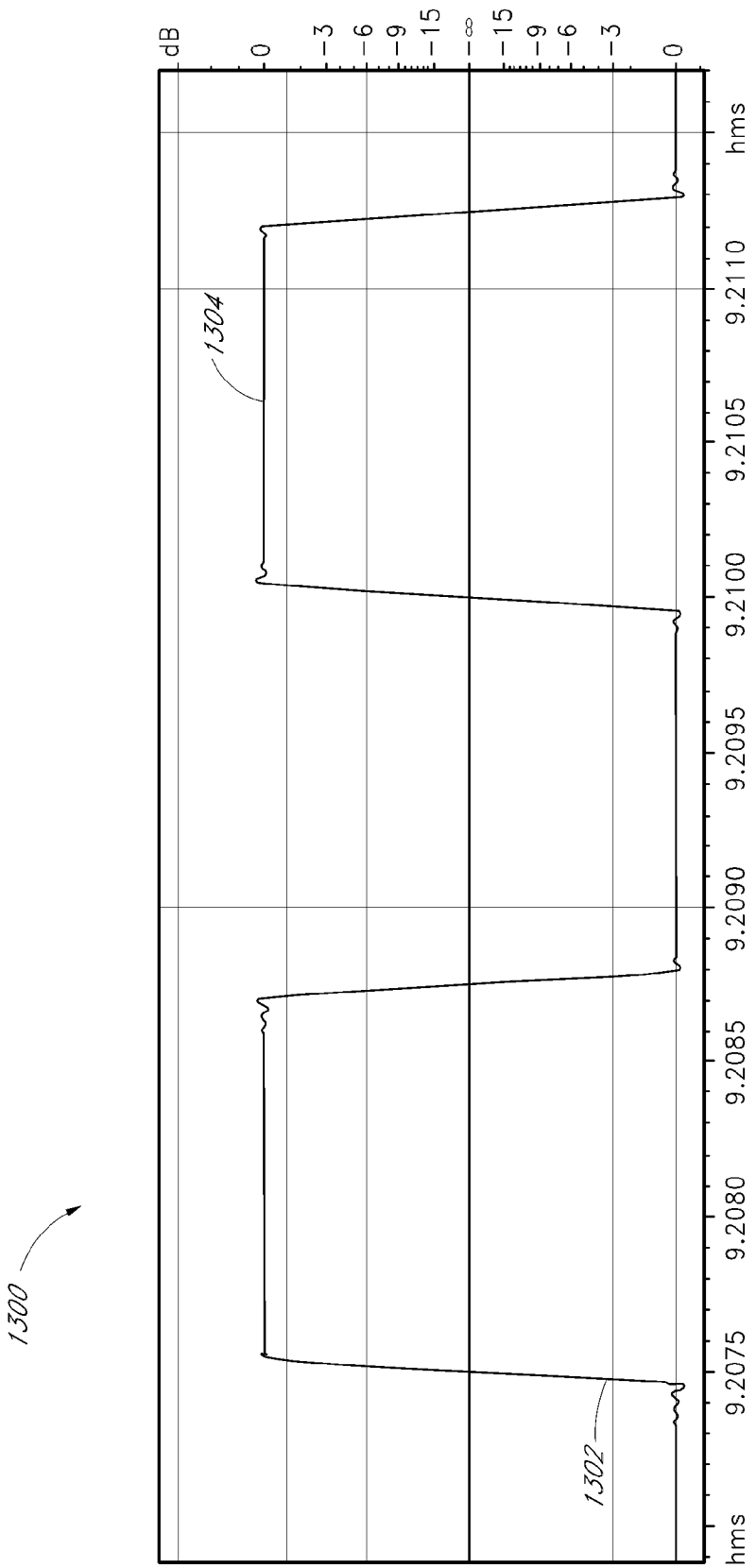
FIG. 13 illustrates an example time domain representation of a clipped sine wave.
Figure 14:
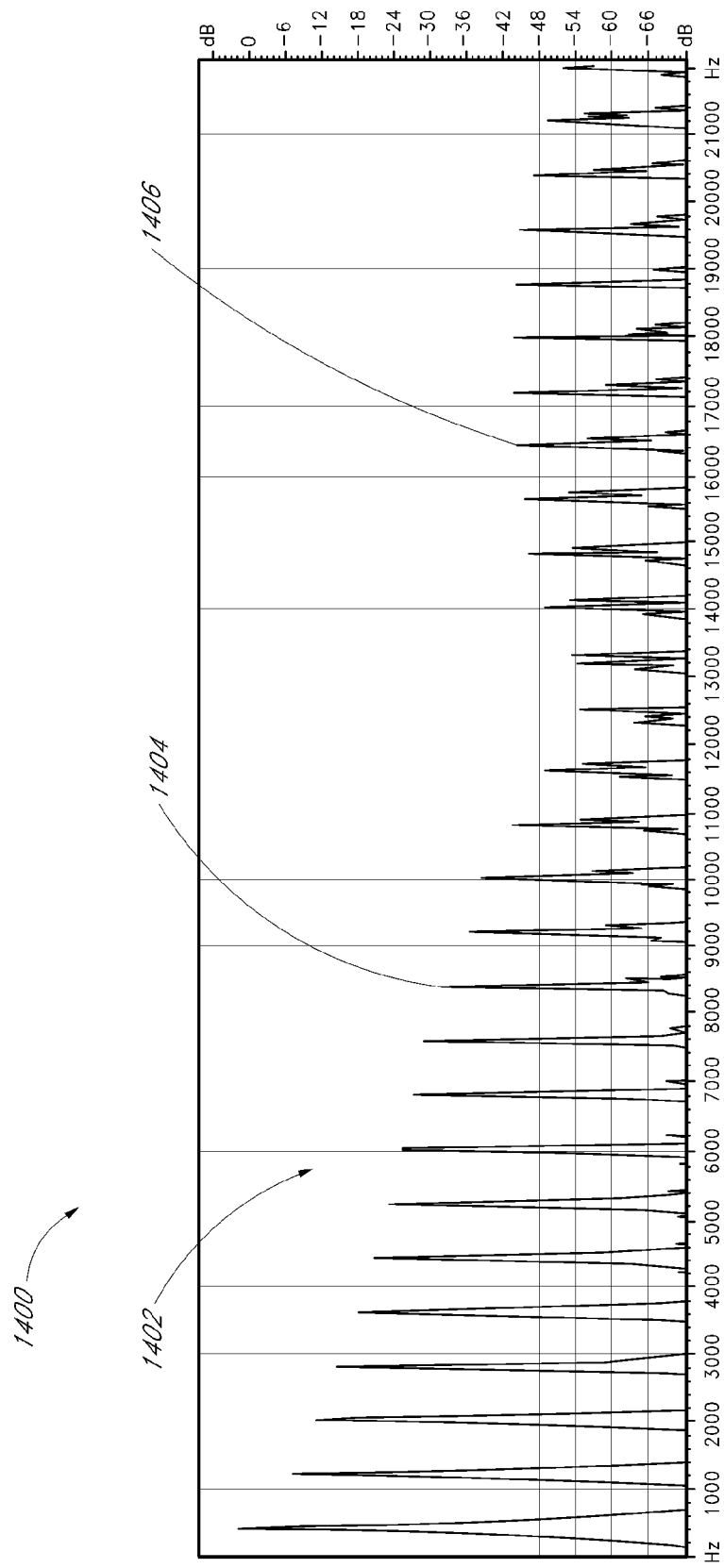
FIG. 14 illustrates an example frequency spectrum of the clipped sine wave of FIG. 13.

FIGS. 11 through 17 illustrate examples of distortion and sum of sines waves. For reference, FIG. 11 illustrates an example time domain plot 1100 of a sine wave 1102. A peak level 1104 of the sine wave 1102 without clipping is shown. The peak level 1104 of the sine wave 1102 is at 0 db, which can be a peak possible digital level in some embodiments. FIG. 12 illustrates an example plot 1200 showing a frequency spectrum 1202 of the sine wave 1102 of FIG. 11. As it is a sinusoid, one frequency is represented.

In certain embodiments, increasing the amplitude of the sine wave 1102 beyond the peak level can result in hard clipping. Hard clipping of a sinusoid 1302 is shown in a plot 1300 of FIG. 13. The clipped sinusoid 1302 includes clipped portions 1304, which are saturated at the peak level. Examples of harmonics 1404 of the clipped sine wave 1302 can be seen in the frequency domain representation 1402 shown in FIG. 14. As shown, the harmonics 1404 can extend as high as the sampling frequency (about 22 kHz in the example FIGURE shown). Certain of the harmonics 1406 are also aliased, causing further distortion.

Figure 15:
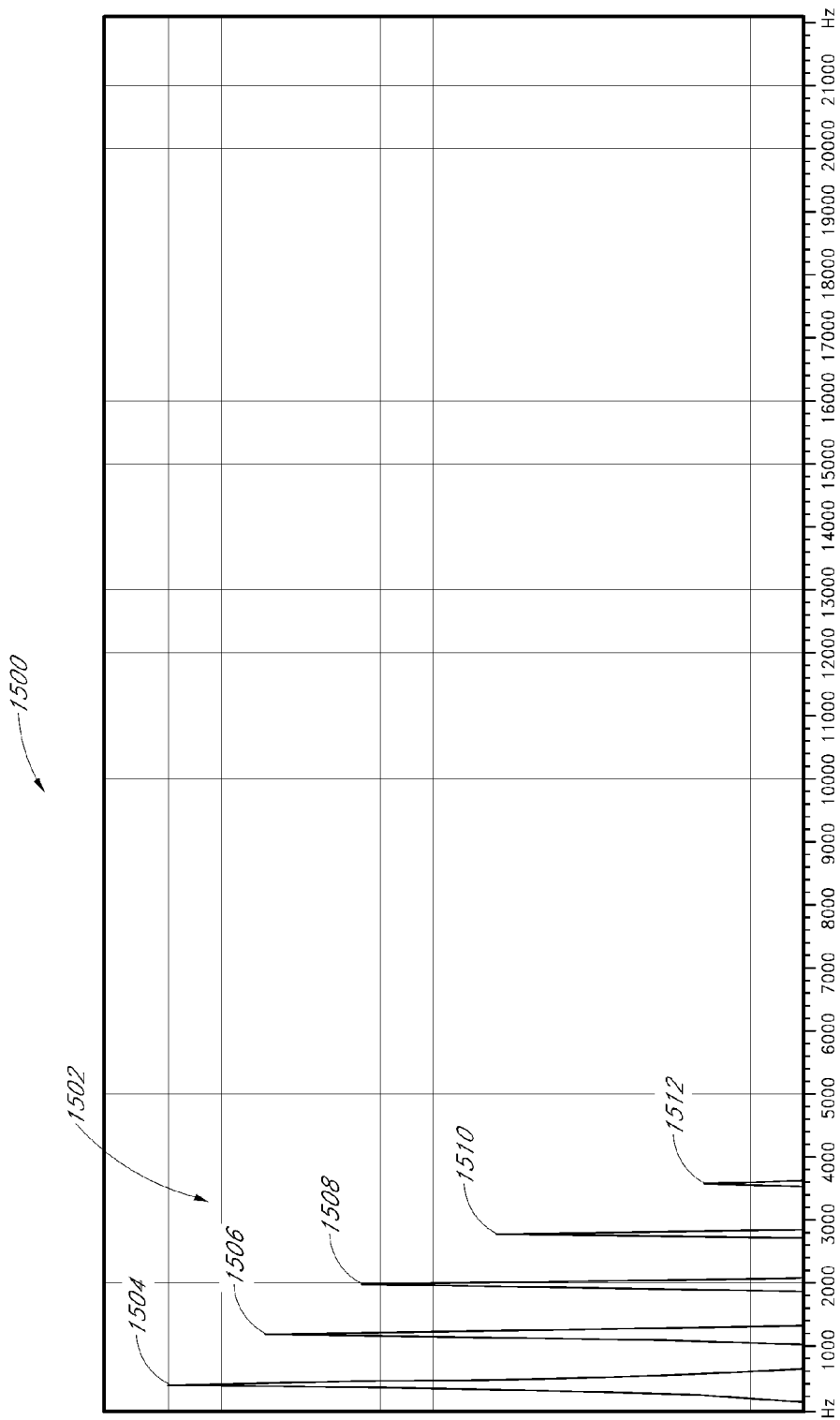
FIG. 15 illustrates an example frequency spectrum having a reduced number of harmonics compared to the clipped sine wave spectrum of FIG. 14.

To avoid the full distortion of hard clipping while still allowing an increase in volume, the distortion control module 1040 can use a composite wave of lower-frequency harmonics, as described above. An example set of harmonics of such a wave is illustrated in FIG. 15, which includes an example frequency response plot 1500 of a composite wave that may be generated in response to a 400 Hz input sine wave. The spectrum in the plot 1500 includes fewer harmonics 1502 than in the full clipping scenario of FIG. 14. In the depicted embodiment, five harmonics 1502 have been generated. The highest harmonic 1502 is at a lower frequency than the high frequency harmonics 1404 of FIG. 14. Aliased harmonics 1406 are also not present in this embodiment.

The example embodiment shown includes harmonics 1502 at about 400 Hz, 1200 Hz, 2000 Hz, 2800 Hz, and 3600 Hz. These harmonics 1502 are odd harmonics 1502, which include the first 1504, third 1506, fifth 1508, seventh 1510, and ninth harmonic 1512. The first harmonic 1504 has an amplitude of about 0 dB, which in certain embodiments, is a highest possible digital amplitude. Successive harmonics 1502 have lower amplitudes as the frequency increases. In an embodiment, the amplitude of the harmonics 1502 decreases monotonically. These amplitudes may vary in other embodiments.

Figure 16:
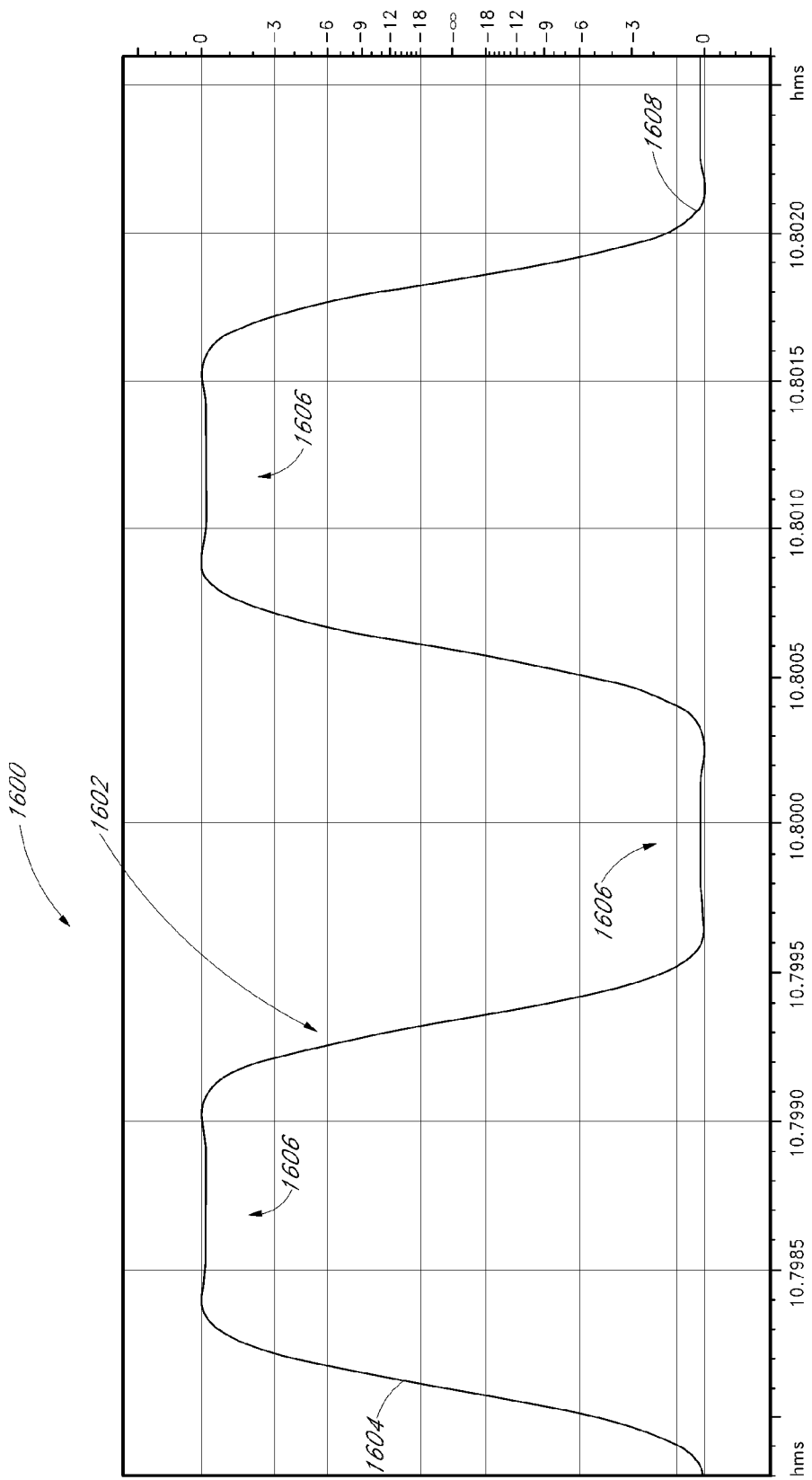
FIG. 16 illustrates an example time domain representation of a partially saturated wave corresponding to the spectrum of FIG. 15.

The result of the controlled distortion provided by lower frequency harmonics can be a rounded and more natural sounding waveform with a higher signal energy or higher average signal energy. An example time domain plot 1600 of a wave 1602 illustrating a sine wave mapped to the harmonics 1504 of FIG. 15 is shown in FIG. 16. The example wave 1602 shown has partially clipped portions 1606 and rounded portions 1608. Comparison between the wave 1602 and the hard clipped wave 1302 shows that the wave 1602 is more rounded than the hard clipped wave 1302. In addition, portions 1604 of the wave 1602 are linear or approximately linear. The curved portions 1608 begin curving at about −3 dB from the clipped portions 1606.

Figure 17:
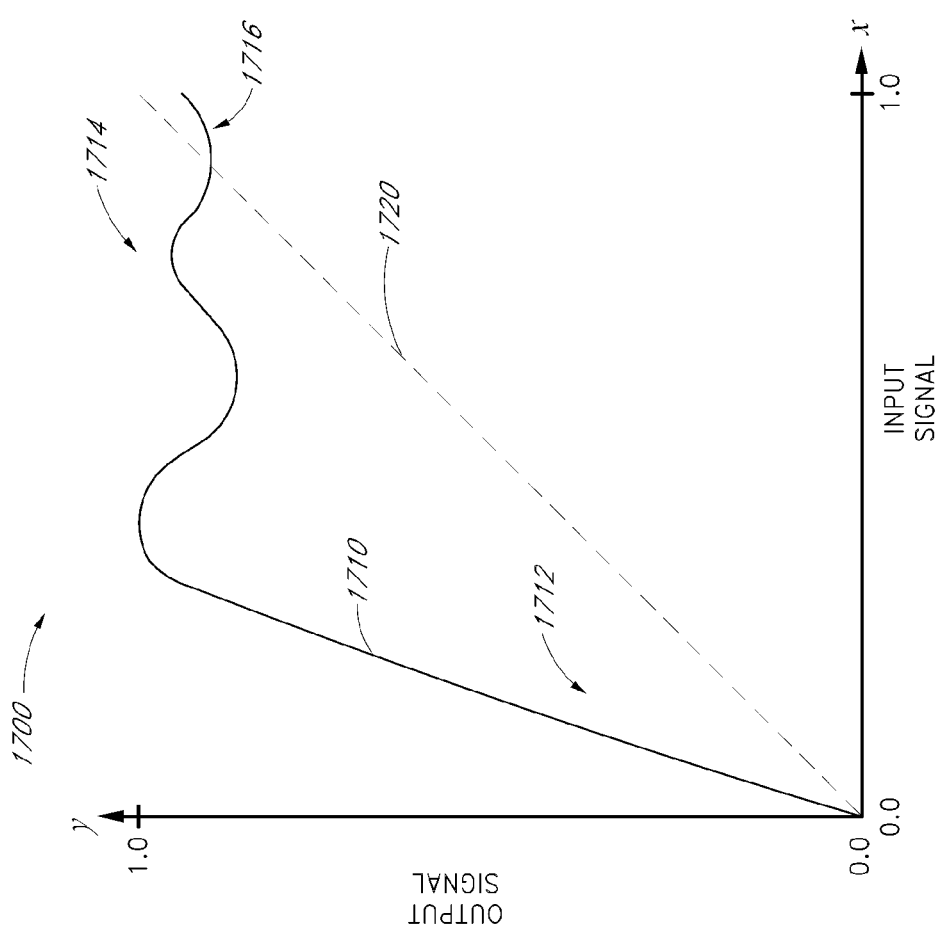
FIG. 17 illustrates an embodiment of a sum-of-sines mapping function.

FIG. 17 illustrates an example plot 1700 that depicts an embodiment of a sum-of-sines mapping function 1710. The sum-of-sines mapping function 1710 shown may be plotted by plotting values in a sum-of-sines table, such as the table 1014 described above. The sum-of-sines mapping function 1710 includes one quarter of a period of a sum-of-sines wave. One quarter of a sum-of-sines wave may be used instead of a full wave for an optimization, which will be described below.

Input signal values are depicted on the x-axis, which include positive amplitude values ranging from 0 to 1. Similarly, output signal values are depicted on the y-axis and also include amplitude values ranging from 0 to 1. Negative amplitude values will be described below. When the distortion control module 140 or 1040 maps an input sample to an output sample, in certain embodiments the input sample is mapped to a point on the mapping function 1710. The mapped output sample may have a greater or lower value than the input sample, depending on where the input sample is mapped.

For clarity, the sum-of-sines mapping function 1710 is shown as a continuous function. However, when implemented in a digital system, the mapping function 1710 may be discrete. In addition, as described above, the mapping function 1710 may not be defined for all input signal values. Thus, the distortion control module 140 or 1040 may interpolate output signal values, for example, between the two nearest points on the mapping function 1710.

A phantom line 1720 is shown for reference, which corresponds to the line y=x. If input samples were to be mapped according to the phantom line 1720, the output samples would be the same as the input samples. The mapping function 1710 includes a linear or approximately linear mapping region 1712 and a nonlinear or approximately nonlinear mapping region 1714. As input sample values falling in the linear mapping region 1712 increase in value, the corresponding output samples in the linear mapping region 1712 increase linearly or substantially linearly. Certain input sample values falling in the nonlinear region 1714 increase nonlinearly or substantially nonlinearly, having varying levels of increase 1714.

Most values of the mapping function 1710 are greater than the phantom line 1720, such that most input samples may be mapped to greater values. However, in region 1716 of the nonlinear mapping region 1714, the values of the mapping function 1710 are less than or equal to the phantom line 1720. In this region 1716, input samples are mapped to lower values. Thus, for example, hard-clipped samples (e.g., having a value of 1.0 or close to 1.0) may be reduced in value.

As mentioned above, the mapping function 1710 includes one quarter of a sum-of-sines wave instead of a full wave. Using a quarter wave (or even half wave) can enable the size of the sum-of-sines table 1014 to be reduced, thereby saving memory. For negative input signal values (e.g., on a scale of [1−,0) or the like), the distortion control module 140, 1040 may reverse the mapping function 1710 across the x-axis and invert the mapping function 1710 across the y-axis. Thereafter, the distortion control module 140, 1040 can apply the mapping function 1710 to the input samples. Alternatively, negative values can be inverted and normalized to the [0, 1] range. Then the mapping function 1710 may be applied, and the resulting output samples can be negated to recover the negative values.

In alternative embodiments, the mapping function 1710 shown may look different depending, for example, on the number of harmonics used to generate the sum-of-sines table 1014. For instance, the linear mapping region 1712 may have a greater or lesser slope. The nonlinear mapping region 1714 may be shaped differently; for example, it may have fewer peaks. Likewise, the region 1716 may be lower or greater in amplitude.

In certain embodiments, the ranges of the x and/or y axis may differ from the [0, 1] ranges described above. Decreasing the x-axis range to [0,a], where a is less than 1, can increase amplification of at least part of the input signal. Conversely, increasing the x-axis range from [0,b], where b is greater than 1, can decrease amplification of at least part of the input signal. Using a value of b that is greater than 1 can beneficially reduce clipping in some embodiments. Similarly, the y axis may be changed to [0,c], where c is less than or greater than 1.

Figure 18:
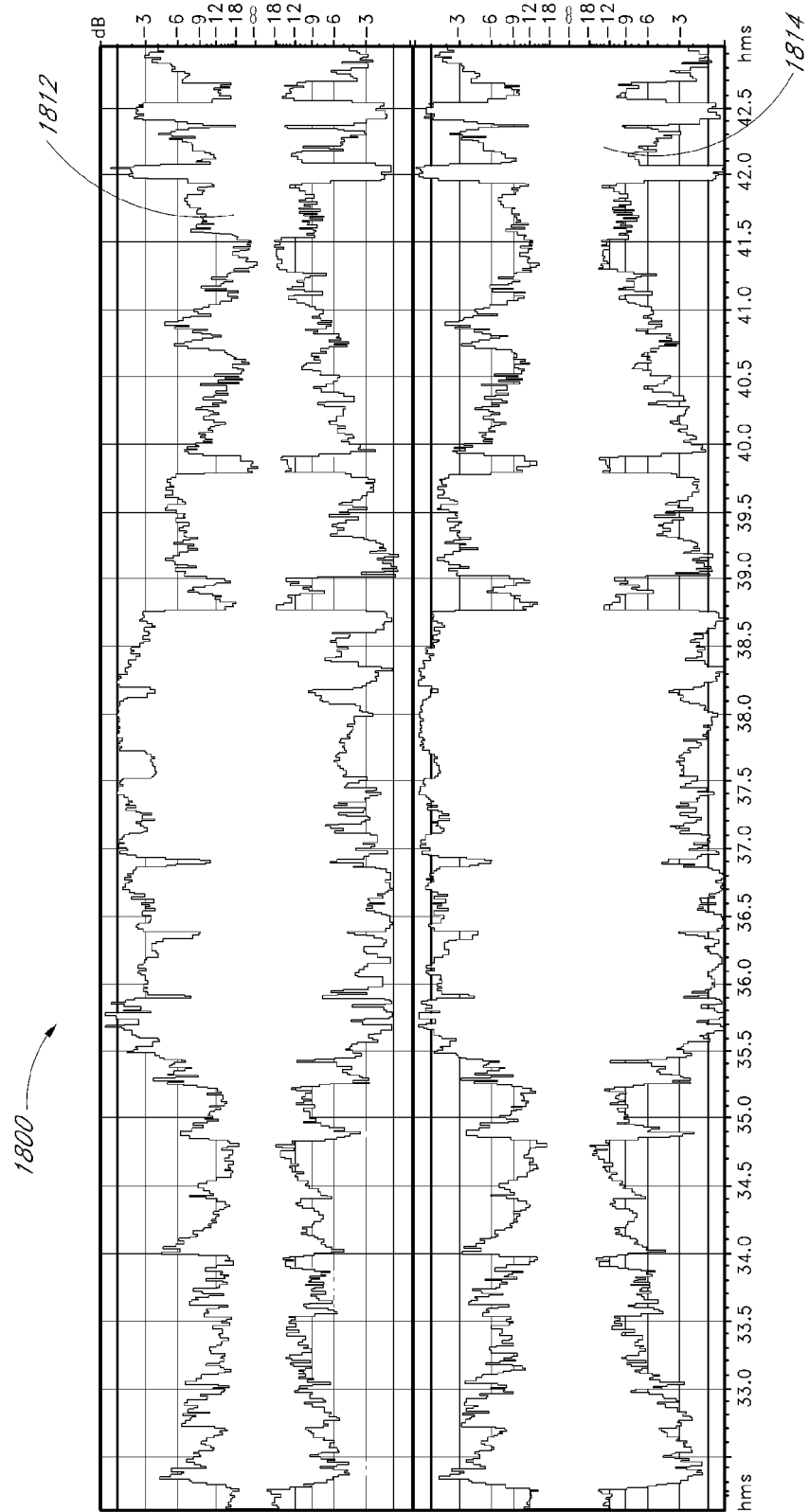
FIG. 18 illustrates an example time domain representation of an audio signal and a distortion controlled version of the signal.

FIG. 18 illustrates a plot 1800 of an example time domain representation of an audio signal 1812 before distortion control is applied. In addition, FIG. 18 shows an example time domain representation of the same audio signal 1814 after distortion control is applied. Approximately 6 dB of additional gain has been introduced into this waveform by using an example implementation of distortion control.

Distortion control may be used for other applications. For example, distortion control may be used to increase bass volume with reduced distortion. Distortion control may also be used in frequency spreading applications. Moreover, distortion control may be used to synthesize instrument sounds or other sounds, for example, by selecting various harmonics to create a desired timbre of an instrument.

VII. Conclusion

Depending on the embodiment, certain acts, events, or functions of any of the algorithms described herein can be performed in a different sequence, may be added, merged, or left out all together (e.g., not all described acts or events are necessary for the practice of the algorithm). Moreover, in certain embodiments, acts or events may be performed concurrently, e.g., through multi-threaded processing, interrupt processing, or multiple processors or processor cores, rather than sequentially.

The various illustrative logical blocks, modules, and algorithm steps described in connection with the embodiments disclosed herein may be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the disclosure.

The various illustrative logical blocks and modules described in connection with the embodiments disclosed herein may be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be a processor, controller, microcontroller, or state machine, combinations of the same, or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated may be made without departing from the spirit of the disclosure. As will be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. A method of reducing clipping in an audio signal, the method comprising:
  receiving an input audio signal;
  providing a sum-of-sines data structure, the sum-of-sines data structure comprising values generated from a sum of harmonically-related sine waves;
  using the sum-of-sines data structure with one or more processors to map the input audio signal to an output audio signal, such that the harmonically-related sine waves are added to the input audio signal; and
  outputting the output audio signal to a speaker, wherein the output audio signal has a greater energy than the input audio signal.

2. The method of claim 1, further comprising generating the sum-of-sine data structure from fewer harmonically-related sine waves than are present in a fully saturated signal.

3. The method of claim 1, wherein the harmonically-related sine waves comprise odd harmonically-related sine waves.

4. The method of claim 1, wherein the harmonically-related sine waves comprise even harmonically-related sine waves.

5. The method of claim 1, further comprising generating the sum-of-sines data structure by populating a first data structure with one period of a first one of the sine waves, populating a second data structure with multiple periods of the first sine wave, and combining values in the first and second data structures.

6. The method of claim 1, wherein the sum-of-sines data structure comprises one quarter of a composite sum-of-sines wave.

7. The method of claim 1, wherein said using the sum-of-sines data structure with one or more processors to map the input audio signal to an output audio signal comprises using interpolation to map the input audio signal to the output audio signal.

* * * * *